(12) United States Patent
Hussell et al.

(10) Patent No.: US 9,897,267 B2
(45) Date of Patent: Feb. 20, 2018

(54) LIGHT EMITTER COMPONENTS, SYSTEMS, AND RELATED METHODS

(71) Applicant: CREE, Inc., Durham, NC (US)

(72) Inventors: Christopher P. Hussell, Cary, NC (US); Sung Chul Joo, Cary, NC (US); Erin Welch, Chapel Hill, NC (US); Peter Scott Andrews, Durham, NC (US); Joseph G. Clark, Raleigh, NC (US); John A. Edmond, Durham, NC (US); Jesse C. Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 216 days.

(21) Appl. No.: 13/838,654

(22) Filed: Mar. 15, 2013

(65) Prior Publication Data
US 2014/0268728 A1     Sep. 18, 2014

(51) Int. Cl.
F21V 23/02 (2006.01)
F21K 9/90 (2016.01)
F21Y 103/10 (2016.01)
F21Y 115/10 (2016.01)

(52) U.S. Cl.
CPC ............ *F21K 9/90* (2013.01); *F21Y 2103/10* (2016.08); *F21Y 2115/10* (2016.08); *H01L 2224/45144* (2013.01); *H01L 2224/48091* (2013.01); *H01L 2224/48137* (2013.01); *Y10T 29/49117* (2015.01)

(58) Field of Classification Search
CPC .......... F21K 9/10; F21K 9/90; F21Y 2115/10; F21Y 2103/10
USPC ......... 362/225, 217.05, 217.01, 221, 249.06; 29/825
See application file for complete search history.

(56) References Cited

U.S. PATENT DOCUMENTS

| 4,946,547 A | 8/1990 | Palmour et al. |
| 5,200,022 A | 4/1993 | Kong et al. |
| RE34,861 E | 2/1995 | Davis et al. |
| 6,914,194 B2 | 7/2005 | Fan |

(Continued)

OTHER PUBLICATIONS

Photograph of Competitor LED Part dated at least as early as Mar. 11, 2013.

(Continued)

*Primary Examiner* — Evan Dzierzynski
(74) *Attorney, Agent, or Firm* — Jenkins, Wilson, Taylor & Hunt, P.A.

(57) ABSTRACT

Light emitter components, systems, and related methods having improved optical efficiency and a lower manufacturing cost are disclosed. In one aspect, a light emitter component can include a substrate having an elongated body and first and second ends. At least a first trace and a second trace can be provided on the substrate. In some aspects, the first trace can be disposed proximate the first end of the substrate and the second trace can be disposed proximate the second end of the substrate, with no other portion of the first trace or second trace being disposed between the first and second ends of the substrate. In some aspects, a string of LED chips can be provided on the substrate. The string of LED chips can be disposed between the first and second ends of the substrate. Angled traces, gaps and light emitter components can also be provided in some aspects.

46 Claims, 12 Drawing Sheets

(56) References Cited

U.S. PATENT DOCUMENTS

| | | | |
|---|---|---|---|
| 7,213,940 | B1 | 5/2007 | Van De Ven et al. |
| 7,791,061 | B2 | 9/2010 | Edmond et al. |
| 8,058,088 | B2 | 11/2011 | Cannon et al. |
| 8,714,772 | B1 | 5/2014 | Levante et al. |
| 8,905,579 | B2 * | 12/2014 | Dobbins et al. ......... 362/249.02 |
| 9,215,792 | B2 | 12/2015 | Hussell |
| 2006/0244622 | A1 | 11/2006 | Wray |
| 2007/0158668 | A1 | 7/2007 | Tarsa et al. |
| 2008/0128723 | A1 | 6/2008 | Pang |
| 2008/0173884 | A1 | 7/2008 | Chitnis et al. |
| 2008/0179611 | A1 | 7/2008 | Chitnis et al. |
| 2008/0258130 | A1 | 10/2008 | Bergmann et al. |
| 2009/0140271 | A1 | 6/2009 | Sah |
| 2009/0184333 | A1 | 7/2009 | Wang et al. |
| 2009/0212304 | A1 | 8/2009 | Wang et al. |
| 2009/0224265 | A1 | 9/2009 | Wang et al. |
| 2010/0039806 | A1 * | 2/2010 | Roberts et al. ............... 362/231 |
| 2010/0053956 | A1 * | 3/2010 | Park et al. .................... 362/235 |
| 2010/0134047 | A1 * | 6/2010 | Hasnain ........................ 315/302 |
| 2010/0155763 | A1 | 6/2010 | Donofrio et al. |
| 2010/0220479 | A1 * | 9/2010 | Yamashita et al. ...... 362/249.02 |
| 2010/0271819 | A1 * | 10/2010 | Kristoffersen ........ F21V 29/004 362/235 |
| 2011/0013400 | A1 | 1/2011 | Kanno et al. |
| 2012/0235199 | A1 | 9/2012 | Andrews et al. |
| 2013/0114255 | A1 * | 5/2013 | Schick et al. ................. 362/236 |
| 2013/0215610 | A1 * | 8/2013 | Tsai et al. ..................... 362/225 |
| 2013/0329425 | A1 | 12/2013 | Lowes et al. |
| 2014/0198497 | A1 * | 7/2014 | Shimizu et al. .............. 362/235 |
| 2014/0265809 | A1 | 9/2014 | Hussell |

OTHER PUBLICATIONS

Restriction Requirement for U.S. Appl. No. 13/839,130 dated Jul. 28, 2014.
Non-Final Office Action for U.S. Appl. No. 13/839,130 dated Sep. 25, 2014.
Photograph of competitor LED Part.
Advisory Action for U.S. Appl. No. 13/839,130 dated Jul. 7, 2015.
Notice of Allowance for U.S. Appl. No. 13/839,130 dated Aug. 6, 2015.
Final Office Action for U.S. Appl. No. 13/839,130 dated Apr. 10, 2015.

* cited by examiner

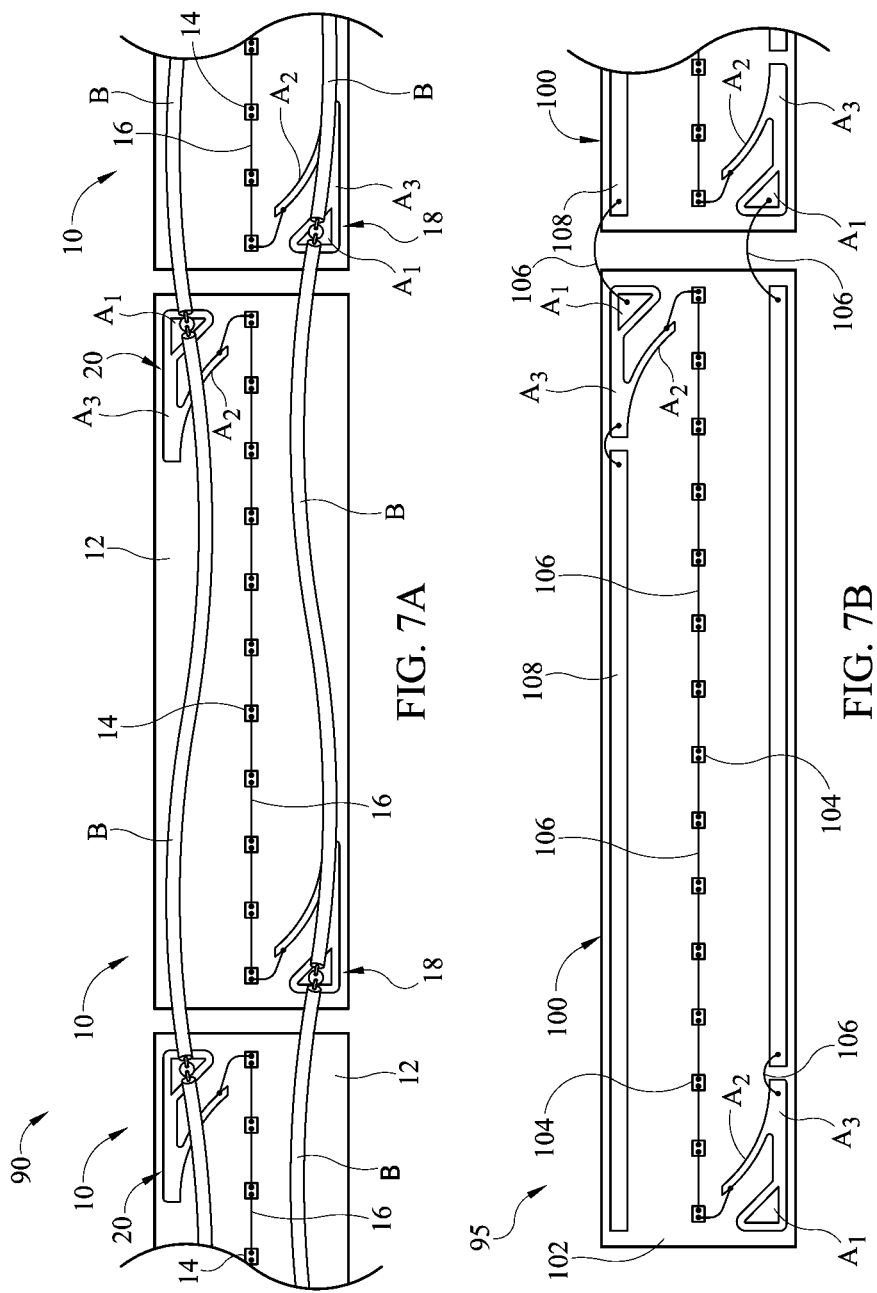

LIGHT EMITTER COMPONENTS, SYSTEMS, AND RELATED METHODS

TECHNICAL FIELD

The subject matter disclosed herein relates generally to light emitter components, systems, and related methods. More particularly, the subject matter disclosed herein relates to light emitting diode (LED) components and systems having improved optical efficiency lower cost.

BACKGROUND

Light emitters, such as light emitting diodes (LEDs) or LED chips are solid state devices that convert electrical energy into light. LED chips can be utilized in light emitter components for providing different colors and patterns of light useful in various lighting and optoelectronic applications. For example, light emitter components can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Brighter, more efficient LED components, which incorporate simpler electrical connections and use less expensive materials, can allow lighting manufacturers to use fewer LED chips to get the same brightness at a lower cost and/or increase brightness levels using the same LED chip count and power. Such improvements can enable delivery of improved light emitter components and/or systems for less total cost than other solutions.

One problem associated with conventional components which incorporate light emitters, such as LED chips, is that the LED chips are attached directly to surfaces of a printed circuit board (PCB) or metal core printed circuit board (MCPCB), which are expensive and include features which interfere with and/or absorb light. One solution to this problem includes depositing electrical traces directly over a ceramic panel, and then attaching the LED chips to the electrical traces. This, however, is disadvantageous as it requires electroplating traces down the entire length of the panel. This increases the cost of manufacturing the LED component, as it requires metallic plating materials and processing equipment. In addition, the metallic traces decrease optical efficiency by absorbing and/or interfering with light. Thus, this solution falls short of achieving a desired decrease in manufacturing costs and/or improved optical efficiency.

Thus, despite the availability of various light emitter components in the marketplace, a need remains for brighter, more cost-effective light emitter components and/or systems which consume the same and/or less power as compared to conventional components. Such components, systems, and methods can also make it easier for end-users to justify switching to LED products from a return on investment or payback perspective.

SUMMARY

In accordance with this disclosure, light emitter components, systems, and methods are disclosed herein and have improved performance. For example, components, systems, and methods described herein can advantageously exhibit improved reflection, improved brightness, improved light extraction, and/or ease of manufacture. In some aspects, an improved, brighter light emitter component can be provided. The light emitter component can include a substrate, a first trace and a second trace provided on the substrate, and a string of LED chips provided on the substrate. In some aspects, the string of LED chips can be disposed between the first trace and the second trace.

In some aspects, the substrate can comprise an elongated body. In some aspects, the first and second traces can be disposed only at proximate the outermost edges or opposing ends of substrate. In some aspects, a majority of the LED chips can be spaced apart from the first trace by approximately 2 millimeters (mm) or more.

In some aspects, the substrate can comprise a ceramic material. In some aspects, substrate can comprise a length of approximately 20 mm or more. In some aspects, the substrate can comprise a length of approximately 80 mm or more.

In some aspects, each of the first and second traces can comprise a length that is less than approximately one half of the overall length of the board or substrate (e.g., less than approximately 10 mm for a 20 mm substrate), a length that is less than approximately one quarter of the overall length of the substrate (e.g., less than approximately 5 mm for a 20 mm substrate), a length that is less than approximately one eighth of the overall length of the substrate (e.g., less than approximately 2.5 mm for a 20 mm substrate), or a length of less than approximately one sixteenth of the overall length of the substrate (e.g., less than approximately 1.25 mm for a 20 mm substrate). In some aspects, each trace can comprise a total length of approximately 1 mm or less.

In some aspects, the string of LED chips can be serially connected between the first and the second trace. In some aspects, LED chips can be serially connected via gold (Au) wires, silver (Ag) wires, copper (Cu) wires, aluminum (Al) wires, and/or combinations or alloys thereof. In some aspects, the string of LED chips can comprise 10 or more LED chips. In some aspects, the string of LED chips can comprise 20 or more LED chips.

In some aspects, a bus wire can extend along a portion of the elongated substrate. In some aspects, the bus wire can be disposed on a back side of the substrate which opposes the string of LED chips. In some aspects, a separate conductive or metal foil area can be disposed over the substrate and extend between portions of the first and second trace.

In some aspects, at least one insulation displacement connector (IDC) can be disposed on the substrate. In some aspects, a first IDC connector can be disposed over the first trace, and a second IDC connector can be disposed over the second trace. In some aspects, the IDC connector can be disposed on a back side of the substrate which opposes the string of LED chips.

In some aspects, a plurality of light emitter components can be provided in a system. Each of the light emitter components can be electrically connected via a bus element, such as a bus wire or a bus surface of conductive foil. In some aspects, the system of light emitter components can be provided in a light bulb, light fixture, or system for use in strip lighting applications.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 7A through 7C are top views illustrating light emitter components and systems according to aspects of the disclosure herein;

DETAILED DESCRIPTION

Figure 1:
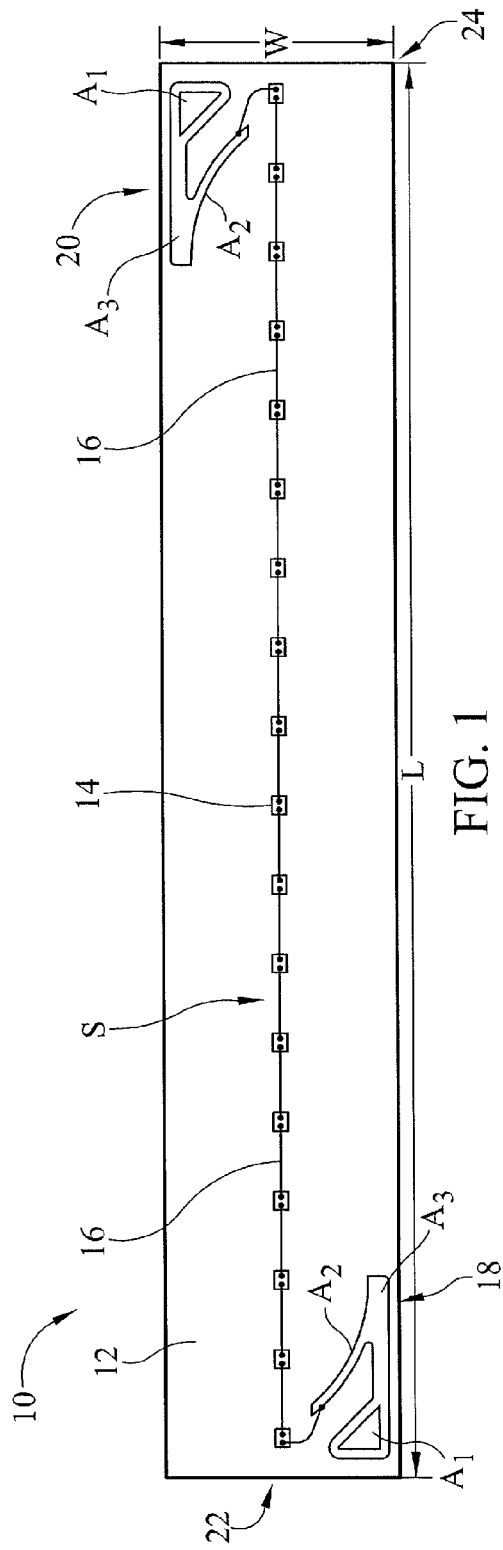
FIG. 1 is a top plan view illustrating a light emitter component according to one aspect of the disclosure herein.

The subject matter disclosed herein is directed to components, systems, and methods for use with light emitters, such as solid state light emitting devices and light emitting diodes (LEDs) or LED chips. Components, systems, and methods described herein can be adapted to exhibit improved performance, for example, improved efficiency, brightness, light extraction, thermal and/or optical efficiency. In some aspects, each of these improvements contributes to and/or can be provided at a lower cost than conventional components.

Components described herein can utilize one or more novel traces, novel bus elements (e.g., bus wires or bus surfaces) disposed along a substrate, novel wirebonds, novel substrates, and/or novel connectors for producing brighter and less expensive light emitter products.

In some aspects, light emitter components described herein can comprise a substrate, a first trace and a second trace provided on the substrate, and a string of LED chips provided on the substrate. In some aspects, the string of LED chips can be disposed between the first trace and the second trace. In some aspects, the substrate can comprise an elongated body.

In some aspects, the first and second traces can comprise novel adhesive and/or flexible materials and can be disposed proximate the outermost edges or opposing ends of substrate. In some aspects, the first and second traces can be disposed only proximate the outermost edges or ends of substrate. In some aspects, the first and second traces can overlap portions of adjacent substrates. In some aspects, traces can be substantially shorter in length than a length of the substrate.

In some aspects, a majority of the LED chips can be spaced apart from the first trace by approximately 2 millimeters (mm) or more. In some aspects, a majority of the LED chips can be spaced apart from the first trace by approximately 5 millimeters (mm) or more.

In some aspects, the substrate can comprise a ceramic material. In some aspects, the board or substrate can comprise a length of approximately 20 mm or more. In some aspects, the substrate can comprise a length of approximately 80 mm or more.

In some aspects, each of the first and second traces can comprise a total length that is less than approximately one half of the overall length of the board or substrate (e.g., less than approximately 10 mm for a 20 mm substrate), a length that is less than approximately one quarter of the overall length of the substrate (e.g., less than approximately 5 mm for a 20 mm substrate), a length that is less than approximately one eighth of the overall length of the substrate (e.g., less than approximately 2.5 mm for a 20 mm substrate), or a length of less than approximately one sixteenth of the overall length of the substrate (e.g., less than approximately 1.25 mm for a 20 mm substrate). In some aspects, each trace can be approximately 1 mm or less in length.

In some aspects, the string of LED chips can be serially connected between the first and the second trace. In some aspects, LED chips can be serially connected via gold (Au) wires, silver (Ag) wires, copper (Cu) wires, aluminum (Al) wires, and/or combinations or alloys thereof. In some aspects, the string of LED chips can comprise 10 or more LED chips. In some aspects, the string of LED chips can comprise 20 or more LED chips.

In some aspects, a bus wire can extend along a portion of the elongated substrate. In some aspects, the bus wire can be disposed on a back side of the substrate which opposes the string of LED chips. In some aspects, a separate conductive or metal foil area can be disposed over the substrate and extend between portions of the first and second trace. In some aspects, at least one insulation displacement connector (IDC) can be disposed on the substrate. In some aspects, a first IDC connector can be disposed over the first trace and a second IDC connector can be disposed over the second trace. In some aspects, the IDC connector can be disposed on a back side of the substrate which opposes the string of LED chips.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

Notably, the novel traces provided at ends of light emitter components, systems, and/or methods disclosed herein can produce more efficient and brighter components by reducing and/or eliminating an amount of light that impinges a surface of one or more traces, thereby, reducing or eliminating an amount of light blocked, absorbed, or otherwise interfered with by the traces.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component or component in addition to the orientation depicted in the figures. For example, if the component or component in the figures is turned over, structure or portion described as "above" other structures or portions would now be oriented "below" the other structures or portions. Likewise, if the component or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", "including", and "having" as used herein should be interpreted as open-ended terms that do not preclude the presence of one or more elements.

As used herein a "ceramic based material" or the term "ceramic based" includes a material that consists primarily of a ceramic material, such as an inorganic material made from compounds of a metal or metalloid and a non-metal (e.g., aluminum nitride (AlN), aluminum oxide ($Al_2O_3$), beryllium oxide (BeO), silicon carbide (SiC)). A "non-ceramic based material" consists primarily of a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861, U.S. Pat. No. 4,946,547, and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa1-xN$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more solid state light emitters such as LED chips, and notably, portions of light emitter components described herein such as portions of the ceramic based substrate, lens, and/or traces can be at least partially coated with one or more phosphors. The phosphors can absorb a portion of light from the LED chip and emit a different wavelength of light such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, a white emitting component can consist of an LED chip that emits light in the blue wavelength spectrum and a phosphor that absorbs some of the blue light and re-emits light in the yellow wavelength spectrum. The component can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Component Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter components and methods according to the present subject matter can also have multiple LED chips of different colors, one or more of which can be white emitting.

FIGS. 1 to 9 are embodiments of components, systems, and methods for use with light emitters, such as LED chips. Light emitter components and systems described herein can advantageously be configured for improved performance, such as improved brightness and/or optical components at an improved, lower cost than conventional components and systems.

FIG. 1 illustrates a light emitter component generally designated 10. Light emitter component 10 can comprise a panel substrate 12 for supporting one or more solid state light emitters, such as one or more LED chips 14. In some aspects, panel substrate 12 can comprise an elongated body adapted for use in strip lighting products, however, any application and/or any size or shape of substrate is contemplated and can be provided. In some aspects, multiple LED chips 14 can be supported and provided over portions of substrate 12. A plurality, an array, and/or any pattern, design, and/or arrangement of LED chips 14 can be provided over substrate 12. For illustration purposes, LED chips 14 are illustrated as being disposed adjacent each other in a substantially straight line, however, LED chips 14 can be arranged in any suitable configuration, such as for example in a "checkerboard" arrangement, wherein LED chips 14 alternate above and/or below a substantially straight line. In other aspects, LED chips 14 can be arranged diagonally and/or angled with respect to each other. Any configuration of LED chips 14 can be provided and is contemplated herein.

In some aspects, LED chips 14 can be serially connected to each other and comprise one or more strings, generally designated S. In some aspects, LED chips 14 can be serially connected to each other in one or more strings S via electrical connectors, such as wirebonds 16. That is, component 10 can comprise one or more strings of chip-to-chip wirebonded LED chips 14. Notably, this arrangement of LED chips 14 can allow for novel placement of electrical traces. In some aspects, electrical traces can be disposed proximate the ends of substrate 12. In some aspects, electrical traces can be disposed only at the ends of substrate 12. For example, in some aspects LED chips 14 can be centrally disposed between a first electrically conductive trace, generally designated 18 and a second electrically conductive trace, generally designated 20.

In some aspects, wirebonds 16 can comprise any suitable electrically conductive material. For example, in some aspects, wirebonds 16 can comprise gold (Au) or an Au alloy. In other aspects, wirebonds 16 can comprise aluminum (Al) or Al alloys, copper (Cu) or Cu alloys, or silver (Ag) or Ag alloys. Notably, Al, Cu and Ag can be less expensive than Au, and further reduce the cost associated with producing light emitter components described herein.

In some aspects, first and second traces 18 and 20 can comprise electrically conductive components or portions of material which provide electrical communication between an electrical current or power source (not shown) and the string of LED chips 14. In some aspects, first trace 18 can be disposed proximate a first end 22 of substrate 12, and second trace 20 can be disposed proximate a second end 24 of substrate 12. In some aspects, no other portion of the first trace 18 or second trace 20 extends or is disposed between the first and second ends 22 and 24 of substrate 12. That is, in some aspects, first and second traces 18 and 20 terminate proximate the ends of the substrate 12, and do not extend in length beyond a length of at least three light emitter chips in a string of chips. In some aspects, first and second traces 18 and 20 do not extend in length beyond a length of at least one light emitter chip. In some aspects, first and second ends 22 and 24 of substrate 12 can be opposing ends and/or opposing outermost edges of substrate 12. In some aspects, first and second traces 18 and 22 extend to a length that is less than one half of the overall length of the substrate, less than one quarter of the overall length of the substrate, less than one eighth of the overall length of the substrate, or less than one sixteenth of the overall length of the substrate.

Notably, applying first and second traces 18 and 20 proximate outermost edges or ends of substrate 12 can conserve materials and/or reduce processing time associated with providing traces, as the traces do not run the entire length of substrate 12. Reduced material consumption and processing times can each advantageously lower the cost associated with manufacturing component 10. The novel traces and/or placement of novel traces can also reduce or eliminate some negative effects that traces may have upon light output, or overall component brightness. For example and in some aspects, traces can comprise metallic materials that may block, absorb, and/or otherwise interfere with light. Thus, minimizing a length of first and second traces 18 and 20, strategically placing the traces near the ends of component 10, and/or increasing or maximizing a distance between LED chips 14 and first and second traces 18 and 20, can in turn provide brighter, more optically efficient components as any effects of traces upon light output can be minimized.

In some aspects, first and second traces 18 and 20 allow LED chips 14 to electrically communicate to a power source (not shown). First and second traces 18 and 20, respectively, can each electrically communicate directly with at least one LED chip 14, for example, first and second traces 18 and 20 can electrically communicate directly with first and last LED chips, respectively, within a given string S of serially connected LED chips 14. In some aspects, first and second traces 18 and 20 can each comprise a first attachment portion A1 and a second attachment portion A2. First and second attachment portions A1 and A2 can be electrically connected via an intervening, third attachment portion A3.

Figure 3A:
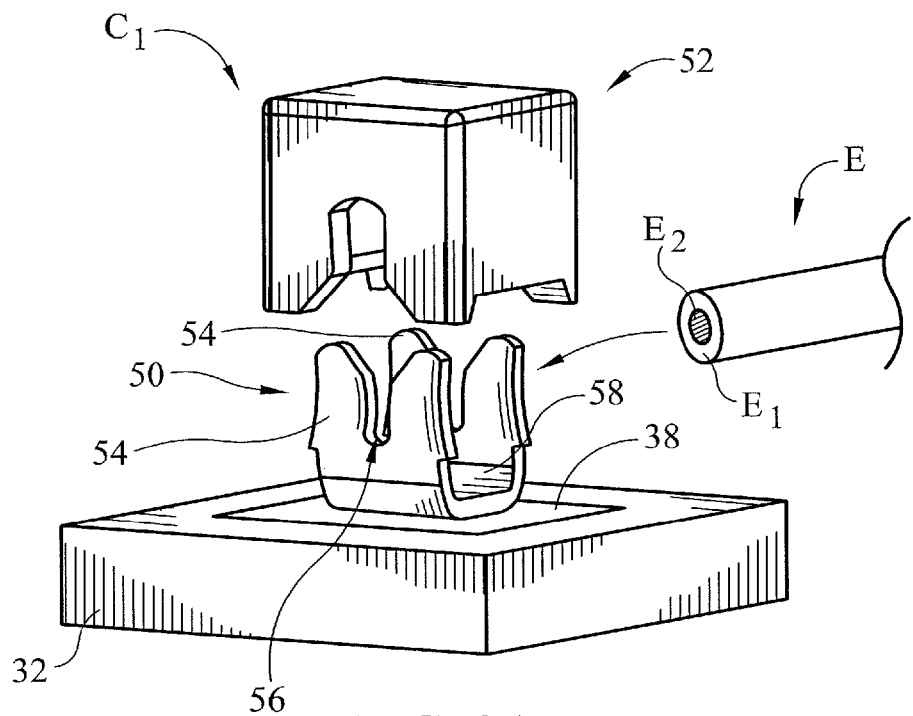
FIGS. 3A and 3B are detailed views illustrating a portion of a light emitter component according to aspects of the disclosure herein.
Figure 3B:
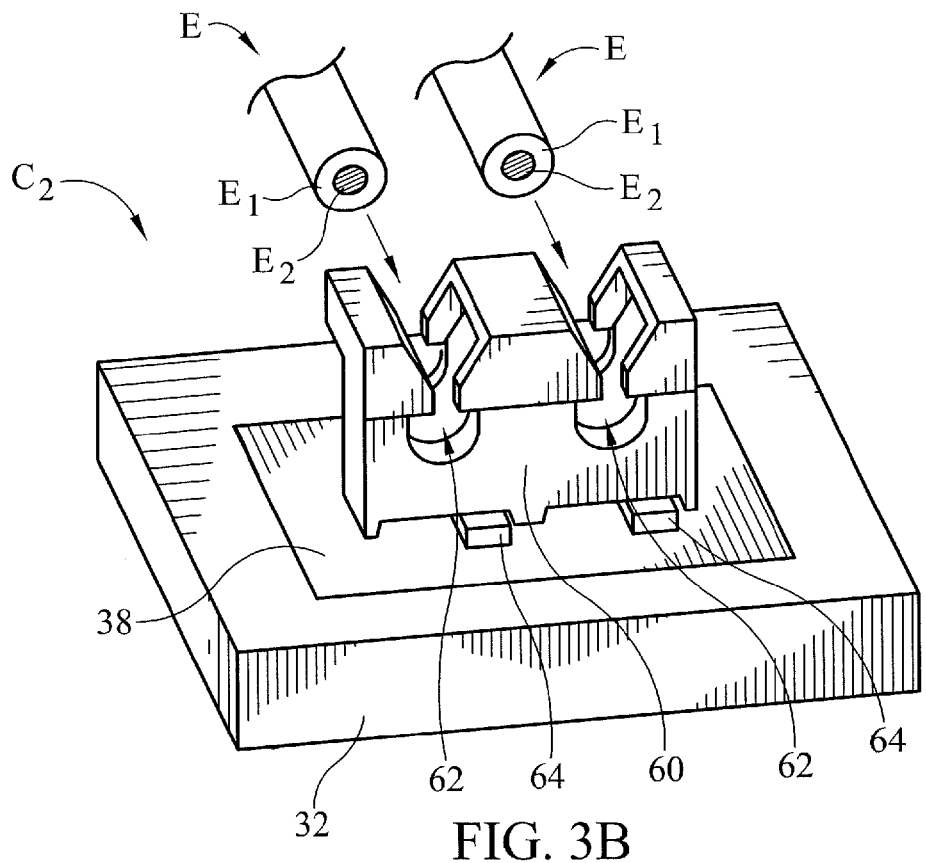

In some aspects, each of first, second, and intervening attachment portions A1, A2, and A3, respectively, can comprise portions of electrically conductive material such as a metal or metal alloy. In some aspects, wires carrying electrical current to or from a power source (not shown) can attach to first attachment portions A1 of traces via soldering, welding, clamping, crimping, hooking, riveting, gluing, via adhesive, combinations thereof, or using any other suitable connecting materials and/or methods. That is, in some aspects, first attachment portion A1 can comprise a solder pad comprising exposed metal, such as exposed copper (Cu), silver (Ag), platinum (Pt), gold (Au), tin (Sn), electroless nickel immersion gold (ENIG), aluminum (Al), combinations thereof, and/or any other electrically conductive material(s). In other aspects, first attachment portion A1 can electrically communicate with and/or comprise a connecting member or connector, such as an insulation displacement connector (IDC) as illustrated in FIGS. 3A and 3B. In some aspects, IDCs can be adapted to fixedly retain and electrically communicate with portions of an electrical wire from a power source.

In some aspects, LED chips 14 can electrically communicate directly with first and second traces 18 and 20, for example, by attaching to second attachment portions A2 via electrical connectors or wirebonds 16. In some aspects, the power source (not shown) and string S of LED chips 14 can electrically communicate via mutually bonding, attaching, and/or electrically communicating to portions of the same trace, such as bonding, attaching, and/or electrically communicating to various attachment portions of first trace 18 and/or second trace 20. In some aspects, portions of first and second traces 18 and 20 can comprise flexible circuitry components, cross-circuitry components, and/or internal circuitry components, such as electrically conductive throughholes or vias, disposed within portions of substrate 12.

In some aspects, first and second traces 18 and 20 can comprise an anode and cathode pair configured to pass electrical current or signal into LED chips 14. For example, electrical current can be conveyed from an outside electrical power source (not shown) into one or first attachment portions A1 and into respective traces 18 and 20. The electrical current can then flow or pass between first and second traces 18 and 20 and into LED chips 14 thereby causing illumination of the plurality of LED chips 14. Although not shown, it is contemplated that in some aspects, substrate 12 can comprise one or more symbol indicators, such as a "+" shaped symbol or shape disposed thereon for indicating the electrical polarity of first trace 18 and/or second trace 20.

According to some aspects, electrical current can flow along a path from a first terminal (e.g., anode or cathode) of a power source (not shown) into first attachment portion A1 of first trace 18, and into second attachment portion A2 of first trace 18 via intervening attachment portion A3. The electrical current can flow from first trace 18 into a first LED chip within string S, and then into each LED chip 14 of string S causing illumination of chips in string S. The electrical current can flow out from a last LED chip of string S and pass into second trace 20. Electrical current can then flow into an electrical member attached to first attachment portion A1. In some aspects, current can flow into another, adjacent component similar to light emitter component 10 via a wire member attached to adjacent first attachment portions A1 of adjacent traces on adjacent substrates. In some aspects, electrical current can flow into a second terminal (e.g., an anode or a cathode) of the power source, for example, where an electrical member, such as a wire member of power source is attached to second attachment portion A2. First and second electrical traces 18 and 20 can be adapted to channel or pass electrical current directly into and out of string S and LED chips 14 within string S.

Substrate 12 can comprise any suitable size or dimension, for example, any suitable length L and/or any suitable width W. Any suitable thickness T (FIG. 4) can also be provided. In some aspects, substrate 12 of component 10 can comprise a length of approximately 5 millimeters (mm) or more, approximately 10 mm or more, approximately 20 mm or more, approximately 40 mm or more, approximately 60 mm or more, approximately 88 mm or more, or more than approximately 100 mm in length L. In some aspects, substrate 12 of component 10 can comprise a width W of approximately 1 mm or more, approximately 2 mm or more, approximately 5 mm or more, approximately 10 mm or more, approximately 15 mm or more, or more than approximately 20 mm in width W. Substrate 12 can comprise any suitable shape, for example, such as a square shape, a rectangular shape, a non-rectangular shape, a circular shape, a curved shape, a symmetric shape, an asymmetric shape, and/or any other shape.

In some aspects, each of the first and second traces 18 and 20 can comprise a length (e.g., a length extending from attachment area A1 through area A3) that is less than approximately one half of the overall length of substrate 12 (e.g., less than approximately 10 mm for a 20 mm substrate), a length that is less than approximately one quarter of the overall length of substrate 12 (e.g., less than approximately 5 mm for a 20 mm substrate), a length that is less than approximately one eighth of the overall length of substrate 12 (e.g., less than approximately 2.5 mm for a 20 mm substrate), or a length of less than approximately one sixteenth of the overall length of substrate 12 (e.g., less than approximately 1.25 mm for a 20 mm substrate). In some aspects, each trace 18 and 20 can comprise a total length of approximately 1 mm or less.

In some aspects, substrate 12 can comprise a substantially flat upper surface upon which one or more LED chips 14 can be linearly disposed along a same planar upper surface of substrate 12. In some aspects, component 10 can be adapted for incorporation into a lighting fixture, bulb, or system, such as a tube light, string light, bi-pin light bulb, or any other directional lighting bulb fixture or system (e.g., FIG. 9). In some aspects, a single component 10 can be used in a fixture or system, in other aspects, multiple, serially or parallel connected components 10 can be used in a fixture or system.

Substrate 12 can comprise any suitable material, for example, an electrically insulating (e.g. substantially non-electrically conductive) material with a low thermal resistance and/or high thermal conductivity. In one aspect, substrate 12 can for example comprise a non-metallic material, such as a ceramic or ceramic based material. For example, substrate 12 can comprise aluminum oxide or alumina ($Al_2O_3$) and derivatives thereof, aluminum nitride (AlN) and derivatives thereof, silicon carbide (SiC) and derivatives thereof, zirconium dioxide or zirconia ($ZrO_2$) and derivatives thereof, titanium dioxide ($TiO_2$) and derivatives thereof, combinations thereof, and/or any other ceramic based or ceramic containing material. In one aspect, substrate 12 can comprise AlN and/or $Al_2O_3$ which can advantageously comprise a low thermal resistance. Material(s) having a low thermal resistance may be advantageous when provided as substrate 12, as heat can more readily dissipate from LED chips 14 and allow light emitter components disclosed herein to run cooler at steady state, thereby increasing lumen output.

In some aspects, substrate 12 can comprise a material having a thermal conductivity of approximately 30 watts per meter kelvin (W/m·K) or more (e.g., zinc oxide (ZnO)). Other acceptable materials have thermal conductivities of approximately 120 W/m·K or more, (e.g., AlN which has a thermal conductivity that can range from approximately 140 to approximately 180 W/m·K). In terms of thermal resistance, some acceptable materials have a thermal resistance of approximately 2° C./W or lower. Other materials may also be used that have thermal characteristics outside the ranges discussed herein.

Figure 2:
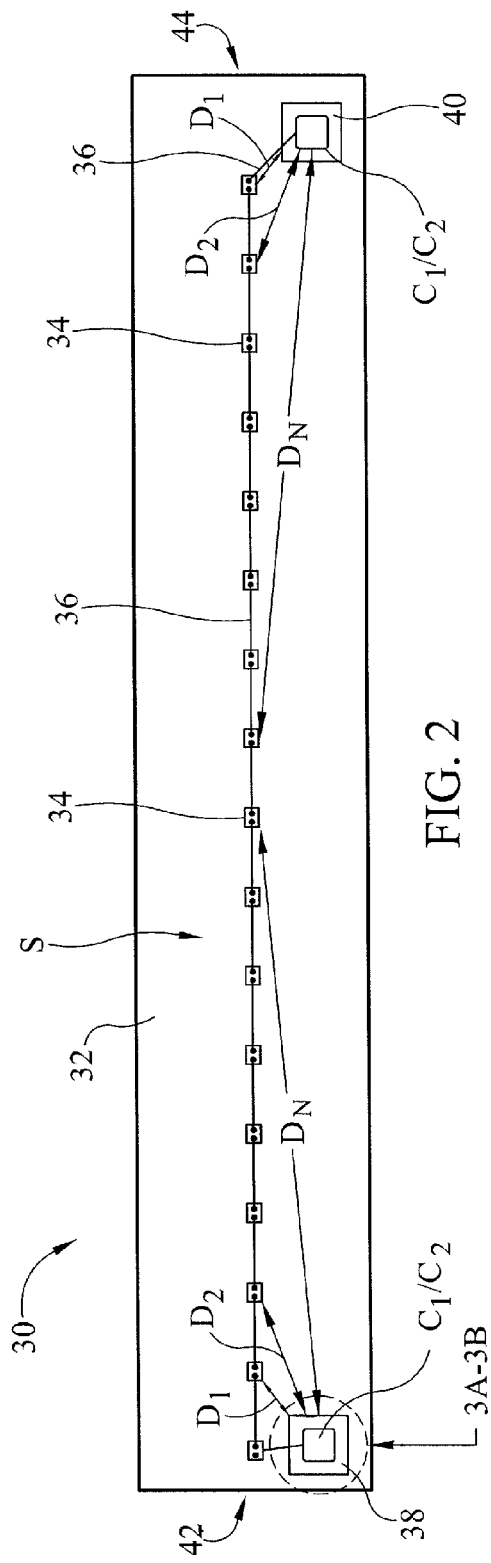
FIG. 2 is a top plan view illustrating a light emitter component according to another aspect of the disclosure herein.

FIG. 2 illustrates another light emitter component, generally designated 30. Light emitter component 30 can be similar in form and function to component 10, however, light emitter component 30 can comprise connector members, as well as traces, disposed at opposing ends or edges of a component substrate 32. One or more light emitters, such as LED chips 34, can be disposed over and/or supported by substrate 32. Substrate 32 can, for example, comprise a ceramic or ceramic based material. LED chips 34 can be mounted or attached to portions of substrate 32 via silicone, adhesive, epoxy, solder, or any other suitable material for attaching LED chips 34 to substrate 32. LED chips 34 can be electrically connected via wirebonds 36. Wirebonds 36 can comprise Au, Ag, Cu, Al, or any combination or alloy thereof. In one aspect, one string S of LED chips 34 can be provided. In further aspects, more than one string S of LED chips 34 can be provided. Notably, LED chips 34 can be serially connected between first and second traces 38 and 40, respectively, and can be disposed at variable distances away from first and second traces 38 and 40 such that traces do not block, absorb, or interfere with light. Thus, components 30 can exhibit an improved brightness, without having to introduce more LED chips 34 and/or without having to use more power.

In some aspects, LED chips 34 can be spaced at various distances $D_1, D_2, \ldots, D_N$ (where N is any whole number integer) away from at least one of first and second traces 38 and 40. Distance D can vary with respect to chip spacing within string S, and with respect to length L of substrate 32. For example, some LED chips 34 can be disposed a first distance $D_1$ away from at least one trace, some LED chips 34 can be spaced a second distance $D_2$ away from at least one trace, and some LED chips 34 can be spaced a distance $D_N$ away from at least one trace. In some aspects, LED chips 34 can be spaced distances $D_1, D_2, \ldots, D_N$ of at least approximately 1 mm or more away from at least one trace, at least approximately 2 mm or more away from at least one trace, at least approximately at least one 5 mm or more away from at least one trace, at least approximately 7 mm or more away from at least one trace, or more than approximately 10 mm away from at least one trace.

For illustration purposes, seventeen LED chips 34 are shown, however, more or less LED chips 34 are contemplated. LED chips 34 can be arranged in multiple strings S and/or an array or multiple arrays. In some aspects, only two LED chips 34 are contemplated, however, more than 2 LED chips 34 can also be provided. In some aspects, more than 5 LED chips 34 can be provided per component 30, in other aspects, more than 10 LED chips 34 can be provided per component 30, in other aspects, more than 15 LED chips 34 can be provided per component 30, in other aspects, more than 20 LED chips 34 can be provided per component 30. In some aspects, component 30 can comprise 26 LED chips 34. LED chips 34 can comprise the same and/or different colors and/or targeted wavelength range, including for example, being configured to emit light that is red, blue, cyan, green, amber, red-orange, yellow, white, and/or combinations thereof. For example, where multiple LED chips 34 are used, LED chips 34 can comprise the same, similar, and/or different targeted wavelength bins including red, blue, cyan, green, amber, red-orange, and/or combinations thereof.

LED chips 34 can comprise any suitable dimension, size, structure, and/or shape. For example, square and/or rectangle LED chips 34 having straight cut and/or bevel cut sides are contemplated herein. In one aspect, LED chips 34 can comprise a chip having a length and/or width that is approximately 0.1 mm (e.g., 100 μm) or more, for example, LED chips 34 can comprise a length and/or width of approximately 0.1 to 0.5 mm; approximately 0.5 to 0.75 mm; approximately 0.75 to 0.85 mm; approximately 0.85 to 0.95 mm; or approximately 1 mm or more. Any size and/or shape of LED chips 34 is contemplated herein. In some aspects, light emitter component 30 can comprise a plurality of light emitters that are each an identical size. In other aspects, light emitters of different sizes (large and small) can be used together within component 30.

Still referring to FIG. 2, substrate 12 can comprise a first edge or end 42 and an opposing second edge or end 44. In some aspects, first and second ends 42 and 44 can be disposed at opposite sides of substrate 12. First and second traces 38 and 40 can be disposed at respective first and second opposing ends 42 and 44. In some aspects, one or more connecting members, such as first and/or second connectors $C_1$ and $C_2$ can be disposed at different ends of component 30. Connectors $C_1$ and $C_2$ are schematically indicated in FIG. 2, and can comprise either a single socket or multi-socketed type of IDC connector as illustrated in FIGS. 3A and 3B. The same type of connector can be installed at both a first end 42 and a second opposing end 44 of component. That is, in some aspects, first connector $C_1$ can be provided at first and second ends 42 and 44. In other aspects, second connector $C_2$ can be provided at first and second ends 42 and 44. In other aspects first connector $C_1$ can be provided at one end and second type of connector $C_2$ can be installed at another end of substrate 32. For example, in some aspects first connector $C_1$ can be disposed at first end 42 and second connector $C_2$ can be disposed at second end 44, or vice versa.

First and/or second connectors $C_1$ and $C_2$ can be disposed over portions of each trace, such as first and second traces 38 and 40. In some aspects, LED chips 34 can electrically communicate with traces and/or connectors. For example, in some aspects first and/or second connectors $C_1$ and $C_2$ can provide a surface for termination of wirebond 36. In other aspects, wirebonds 36 can terminate directly at portions of first and second traces 38 and 40. Traces and/or connectors provide areas for mutually connecting a power source (not shown) to LED chips 34 for providing illumination of the chips. Notably, first and second traces 38 and 40 as well as first and/or second connectors $C_1$ and/or $C_2$ can be provided at opposing end portions of substrate 32 for minimizing or preventing interference of light by such components, thereby improving brightness and/or light extraction from component 30.

In some aspects, first and second traces 38 and 40 can be substantially smaller in length than a length L of substrate 32. For example, a length of first and second traces 38 and 40 can be less than approximately half the length of substrate 32, less than approximately one-quarter the length of substrate 32, less than approximately one-fifth the length of substrate 32, less than approximately one-tenth the length of substrate 32, less than approximately one-sixteenth the length of substrate 32, or less than approximately one-twentieth the length of substrate 32.

In some aspects, first and second traces 38 and 40 can be substantially smaller in width than width W of substrate 32. For example, a width of first and second traces 38 and 40 can be less than approximately half the width of substrate 32, less than approximately one-quarter the width of substrate 32, less than approximately one-fifth the width of substrate 32, less than approximately one-tenth the width of substrate 32, or less than approximately one-sixteenth the width of substrate 32.

In some aspects, LED chips 34 can be spaced at various distances $D_1, D_2, \ldots, D_N$ (where N is any whole number integer) away from connectors including first and/or second connectors $C_1$ and/or $C_2$, in addition to being spaced apart from traces. For example, some LED chips 34 can be disposed at least a first distance $D_1$ away from at least one connector, some LED chips 34 can be spaced at least a second distance $D_2$ away from at least one connector, some LED chips 34 can be spaced at least a distance $D_N$ away from at least one connector. In some aspects, LED chips 34 can be spaced at various distances $D_1, D_2, \ldots, D_N$ away from at least one connector, for example, at least approximately 1 mm or more away from a connector, at least approximately 2 mm or more away from a connector, at least approximately 5 mm or more away from away from a connector, at least approximately 7 mm or more away from a connector, or more than approximately 10 mm away from a connector. In some aspects, a majority of LED chips 34 disposed on substrate 12 can be spaced at least approximately 2 mm or more away from a trace and/or a connector. In some aspects, a majority of LED chips 34 disposed on substrate 12 can be spaced at least approximately 5 mm or more away from a trace and/or a connector.

FIGS. 3A and 3B illustrate different embodiments of connectors for use in light emitter components. In one aspect, connectors can comprise IDCs adapted to electrically couple LED chips 34 (FIG. 2) to a power source (not shown). Referring to FIG. 3A and in some aspects, first connector $C_1$ can be mounted over a portion of a trace, such as first trace 38. In one aspect, a component can comprise at least two connectors provided over two opposing ends or edges of substrate 32. In one aspect, first connector $C_1$ can comprise a base or body portion generally designated 50 and an optional protective cap portion 52. Base or body portion 50 can comprise one or more leg portions 54 separated by one or more gaps generally designated 56. Leg portions 54 can be configured to displace (e.g., via cutting, piercing, or biting) an insulated portion $E_1$ of an electrical wire E, thereby piercing through the insulated covering and electrically connecting with a conductive portion $E_2$ of electrical wire E. In some aspects, electrical wire E can electrically communicate with a power source (not shown) and supply electrical current to light emitter component 30. In some aspects, electrical wire E can comprise a bus wire (see e.g., FIG. 7A) for "bussing" or supplying electrical current from the power source to adjacent light emitter components 30.

Base portion 50 can comprise a metal, metal alloy, and/or any other suitable material which can be electrically conductive. Base portion 50 can further comprise a surface 58 adapted to physically and electrically connect with one or more wirebonds 36 (FIG. 2). In some aspects, one or more LED chips 34 (FIG. 2) can electrically communicate with first connector $C_1$ by wirebonding to portions of surface 58. First connector $C_1$ can, therefore, provide surfaces to which LED chips 34 (FIG. 2) and a power source (e.g., via electrical wire E) can electrically communicate. Thus, first connector $C_1$ can electrically couple string S of LED chips 34 (FIG. 2) to a power source and/or other electrical components such as a bus wire. Protective cap 52 can optionally be provided over portions of electrical wire E and base 50, upon feeding electrical wire E between one or more leg portions 54.

As FIG. 3B illustrates, a multi-socketed connector can also be provided over one or more portions of substrate 32. Multi-socketed connectors can allow more than one electrical connector from multiple different electrical components to connect and electrically communicate. In one aspect, second connector $C_2$ can comprise at least two sockets disposed in a body portion 60. More than two sockets can be provided and are contemplated herein. In some aspects, each socket can be adapted to receive a portion of an electrical wire E and pierce through an insulated portion $E_1$ of wire for electrically connecting to a conductive portion $E_2$ of wire. Electrical wires E can be received between and/or within one or more gap portions 62. Side walls about gap portions 62 can pierce, "bite", or otherwise displace insulated portion $E_1$ of electrical wire E for connecting to conductive portion $E_2$. In some aspects, second connector $C_2$ can electrically couple or connect more than two electrical sources or components. For example, in some aspects second connector $C_2$ can be adapted to electrically connect a power source, one or more strings of LED chips 34 (FIG. 2), an ESD protection device, a surge protector, a controller, a switch, a bus wire and/or any other source or carrier of electrical current.

In one aspect, electrical wire E from a power source can be received in a first socket between side walls of at least one gap generally designated 62. In some aspects, electrical wires can comprise bus wires adapted to carry electrical current from the power source to multiple boards or substrates as described below with respect to FIG. 7A. In other aspects, an electrical wire E from an electrostatic discharge (ESD) protection device (e.g., a Zener diode, surface mount varistor, and/or a differently dimensioned and/or smaller LED chip arranged reverse biased to LED chips 34, FIG. 2) can be received in a second, adjacent socket between side walls of at least one other gap 62. In some aspects, a wire E from one or more LED chips 34 (FIG. 3) can be received in a socket between a gap 62. In other aspects, one or more LED chips 34 can be wirebonded to a portion of trace 38 and/or a portion of second connector $C_2$. That is, in some aspects one or more wirebonds 36 (FIG. 2) can terminate over portions of second connector $C_2$. In other aspects, LED chips can wirebond to electrical trace 38. Electrical elements 64 of second connector $C_2$ can electrically communicate with portions of trace 38, such that electrical wires E connected to second connector $C_2$ can be electrically coupled to trace 38 and any LED chips 34 (FIG. 2) wirebonded thereto.

Figure 4:
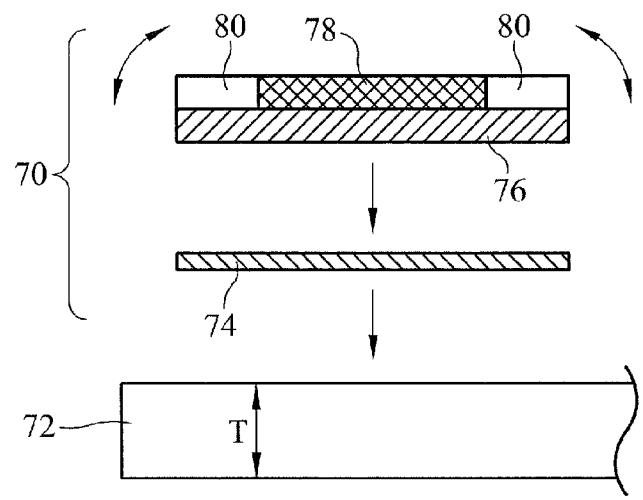
FIG. 4 is an exploded view illustrating a portion of a light emitter component according to one aspect of the disclosure herein.

A sectional view of a portion of a trace or a trace, generally designated 70, is illustrated in FIG. 4. In one aspect, the sectional view of trace 70 can be a sectional view of first and second traces 38 and 40 schematically illustrated in FIG. 2. In other aspects, trace 70 can be a sectional view of one or more portions of first and second traces 18 and 20 as shown and described in FIG. 1. Trace 70 can comprise one or more layers of material, one or more of which can be directly applied over portions of a substrate 72. Substrate 72 can be similar in form and/or function to any previously described panel substrates (e.g., 12 or 32) and can comprise a ceramic material or a ceramic based material.

In some aspects, trace 70 can comprise one or more layers of material, including an adhesive layer 74 of material. Adhesive layer 74 can comprise any suitable material, such as a flexible tape or flexible adhesive material adapted to stick or adhere to portions of substrate 72. In some aspects, adhesive layer 74 can be integrally formed as a portion of trace 70. In other aspects, adhesive layer 74 can comprise a standalone layer that can be applied prior to application of other, subsequent layers of trace 70.

In some aspects, trace 70 can further comprise a dielectric layer 76 of material. Dielectric layer 76 can comprise a layer of glass, FR4 (or FR-4), silicon, quartz, plastic, or any other suitable material. In some aspects, FR4 materials can comprise any materials within the accepted international grade designation for fiberglass reinforced epoxy laminates that are flame retardant. In some aspects, dielectric layer 76 can comprise a laminate structure or laminate material.

In some aspects, trace 70 can further comprise an electrically conductive portion or layer 78 of material. In some aspects, conductive layer 78 can be disposed over portions of dielectric layer 76. Conductive layer 78 can comprise any electrically conductive material such as a metal or metal alloy. In some aspects, conductive layer 78 can be adapted to electrically communicate directly with one or more LED chips 34 via wirebonding (e.g., via wirebonding to portion A2, FIG. 1). In other aspects, conductive layer 78 can be adapted to electrically communicate directly with portions of an electrical wire, such as a wire carrying current directly or indirectly from a power source, via soldering one or more electrical wires associated with the power source directly to portions of conductive layer 78 (e.g., soldering electrical wires to first attachment portion A1, FIG. 1). Conductive layer can comprise a layer of exposed metal, such as exposed Cu, Ag, Pt, Au, Sn, electroless nickel immersion gold (ENIG), Al, combinations thereof, and/or any other electrically conductive material(s).

In some aspects, conductive layer 78 can comprise a single material. In other aspects, conductive layer 78 can comprise multiple different materials. For example, where conductive layer 78 comprises multiple different materials, an adhesion layer of material can be provided, an electrically conductive layer of material can be provided over the adhesion layer, and a reflective layer can be provided over the electrically conductive layer of material. Conductive layer 78 and/or any portions thereof can be deposited via electroplating, sputtering, electroless plating, and/or combinations thereof over portions of dielectric layer 76.

In some aspects, an adhesion layer of Ti, for example, that can be between approximately 0.05 µm and 0.15 µm thick can be provided over dielectric layer 76. In some aspects, conductive layer 78 can comprise at least one layer of Cu that can be applied directly over dielectric layer 76, or directly over the adhesion layer of material. In some aspects, conductive layer 78 can comprise at least one layer of Cu that can, for example, be approximately 50 µm thick or less. In some aspects, conductive layer 78 can comprise at least one layer of Cu that is approximately 50 µm thick, approximately 45 µm thick, approximately 40 µm thick, approximately 35 µm thick, approximately 30 µm thick, approximately 25 µm thick, approximately 20 µm thick, approximately 15 µm thick, approximately 10 µm thick, or less than 10 µm thick. In some aspects, a reflective layer of Ag can be provided over the Cu of conductive layer 78, and the reflective layer can be between approximately 0.1 µm and 1.0 µm thick. Where used, a reflective layer can be approximately 0.1 to 0.2 µm thick, approximately 0.2 to 0.5 µm thick, approximately 0.5 to 0.8 thick, and/or approximately 0.8 to 1 µm thick.

In some aspects, trace 70 can further comprise one or more portions of a solder mask 80 material. Solder mask 80 can for example comprise a white or silver-white liquid curable solder mask material. Solder mask 80 can be disposed adjacent portions of conductive layer 78 and can be disposed over portions of dielectric layer 76. Solder mask 80 can further improve the brightness and/or overall optical performance of emitter component as it can be adapted to reflect light. Portions of solder mask 80 and/or conductive layer 78 can optionally be covered or layered with an optical conversion or wavelength conversion material, such as at least one phosphor, lumiphor, and/or more than one phosphoric or lumiphoric material.

Notably, trace 70 and/or portions thereof can be flexible as indicated by the double sided arrows in FIG. 4. In some aspects, trace 70 can comprise a flexible tape which can be cut, or otherwise shaped or formed, to an appropriate size. In some aspects, trace 70 can comprise an inexpensive flexible tape which can reduce the cost associated with providing light emitter components described herein. In some aspects, trace 70 can be applied only proximate the ends and/or corners of substrate 72 to reduce and/or eliminate interference with light by trace components. In some aspects, trace 70 can comprise a PCB trace overlay provided on a ceramic substrate 72 for use as a substantial linear light emitter component. In some aspects, trace 70 can comprise a segmented PCB trace overlay provided on a ceramic substrate 72 for use as a substantial linear light emitter component.

Substrate 72 can comprise a thickness T as illustrated in FIG. 4. In some aspects, substrate 72 can comprise a thickness T upon which electrical components, including traces and/or connectors, (FIGS. 3A/3B) can be deposited or applied. Thickness T can for example range from approximately 0.1 mm to 5 mm. In some aspects, thickness T can be approximately 1 mm. In some aspects, thickness T can comprise any sub range of thickness between approximately 0.1 mm and 5 mm, including for example, a range of approximately 0.1 to 0.5 mm; 0.5 to 1.0 mm, 1.0 mm to 2.5 mm, or 2.5 mm to 5 mm. Any thickness T is contemplated.

Figure 5:
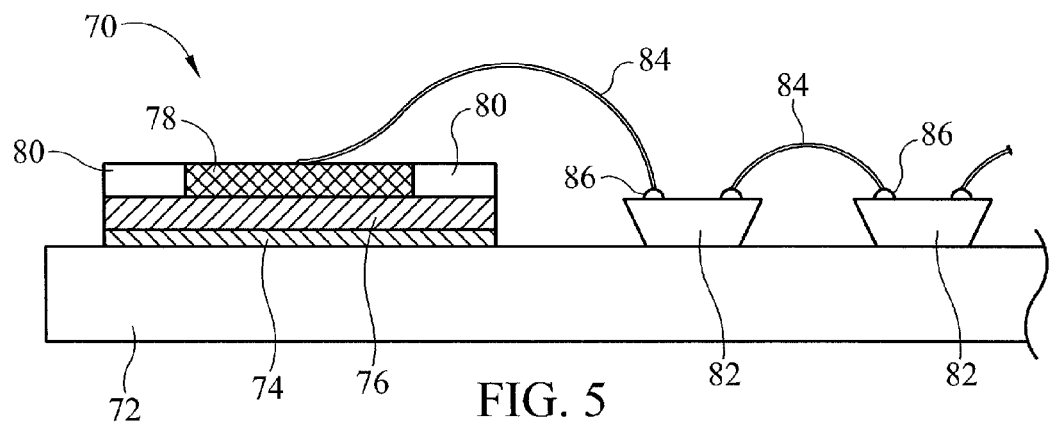
FIG. 5 is a sectional view illustrating a portion of a light emitter component according to one aspect of the disclosure herein.

As FIG. 5 illustrates, at least one LED chip 82 can be directly attached to a portion of trace 70. In some aspects, one or more LED chips such as LED chip 82 can electrically communicate with conductive layer 78 of trace 70 via at least one wirebond 84. In some aspects, another electrical component such as wires from a power source, a bus wire, or an ESD protection device can also be attached to portions of trace 70, either by being soldered thereto or retained by a connector disposed over trace 70 (e.g., as illustrated in FIGS. 3A/3B). Electrical trace 70 can be adapted to transfer or pass electrical current directly into at least one LED chip 82 via at least one wirebond 84.

LED chips 82 can comprise electrical terminals or contact such as bond pads 86 for providing chip-to-chip bonding. Wirebonds 84 can extend between adjacent LED chips 82 within a serially connected string of LED chips 82. Wirebonds 84 can comprise Au, Ag, Cu, Al, or any combination or alloy thereof. Bond pads 86 can both be disposed on an upper surface of LED chips 82, can both be disposed on a lower surface of LED chips 82 (e.g., horizontally structured chips), or a first bond pad 86 can be disposed on an upper surface of the LED chips 82 and the second bond pad 86 can be disposed on the bottom surface (e.g., vertically structured chips). LED chips 82 can comprise any size, shape, color, and/or structure.

Figure 6:
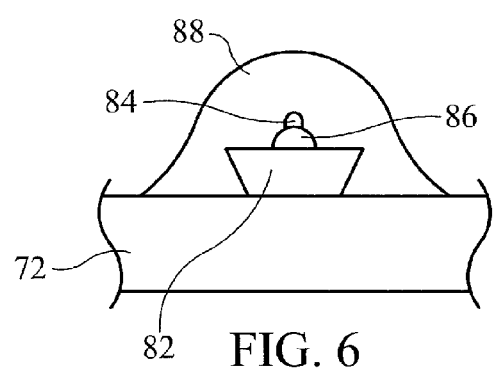
FIG. 6 is a sectional view illustrating a portion of a light emitter component according to one aspect of the disclosure herein.

In some aspects and as illustrated in FIG. 6, an optical structure or optical layer 88 can optionally be provided over at least one LED chip 82. In some aspects, optical layer 88 can be provided over each LED chip 82 in a string of LED chips (e.g., each LED chips in string S, FIG. 1). Optical layer 88 can be disposed over portions of each LED chip 82 and over portions of wirebonds 84 for providing physical, mechanical, and/or chemical protection thereof. Optical layer 88 can also affect beam pattern or beam shaping for light emitted by LED chips 82 such that light can be emitted in a single or in multiple different directions, as desired.

In some aspects, optical layer 88 can comprise any member or material configured to produce light output of a desired shape and/or position light in a desired direction, and can comprise a layer of encapsulant and/or a lens. In some aspects, optical layer 88 can comprise a lens overmolded each individual LED chip 82. In other aspects, optical layer 88 can comprise a layer of silicone encapsulant dispensed in a bead or row of encapsulant over each LED chip 82 in a given string of LED chips. In some aspects, optical material 88 can comprise any material, such as an epoxy, plastic, glass, and/or silicone material, and can be provided using any method, such as encapsulating or molding. It is understood that optical material 88 can also at least partially be textured to improve light extraction and/or be coated with or contain optical conversion, wavelength conversion, light scattering, and/or reflective materials such as phosphors or light scattering particles.

In some aspects, at least a portion of optical layer 88 can be at least partially concave with respect to substrate 72. In some aspects, optical layer 88 can be dispensed and then optionally cured upside down to produce the partially concave and/or curved cross-sectional shape. In some aspects, a mold can be used to produce the partially concave and/or curved cross-sectional shape. In some aspects, optical layer 88 can comprise a substantially hemispherical, curved, domed, symmetric, or asymmetric shaped cross-section, however, any shape of optical layer 88 can be provided. It is further understood that the optical layer 88 can be adapted for use with a secondary lens or optics that can be included over optical layer 88 by the end user to facilitate beam shaping. These secondary lenses are generally known in the art, with many of them being commercially available.

In some aspects, optical layer 88 can comprise an optical conversion or wavelength conversion material provided therein. The optical conversion or wavelength conversion material can be adapted to emit light upon activation of light emitted by one or more LED chips 82. That is, portions of optical layer 88 can comprise a yellow, blue, red, or green phosphor material adapted to emit yellow, blue, red, green, or combinations of colored light upon impingement of light emitted by one or more LED chips 82. Wavelength conversion material can comprise one or more binders, phosphors, lumiphors, or a phosphor or lumiphor containing material and/or binder applied via any suitable technique. In one aspect, the wavelength conversion material can absorb at least some of the light emitted from any one of the multiple LED chips 82 and can in turn emit light having a different wavelength such that light emitter component emits a combination of light from one or more LED chips 82 and a phosphor. In some aspects, optical layer 88 can be sprayed with phosphor or other wavelength conversion material. In some aspects, optical layer 88 can be coated with a phosphor by lamination of a tape cast.

In one aspect, light emitter components shown and described herein can emit light that is perceived as white light of approximately 2700 to 7000K, such as cool white (CW) light around 6000K or warm white (WW) light around 3000K. In one aspect, one or more LED chips 82 selected for use can comprise wavelengths targeting CW or WW light upon, for example, mixing with light emitted from the phosphors or a phosphor containing material. Any suitable wavelength bin and/or phosphor combination can be selected depending upon the application and desired light emission. Phosphors can be adapted to emit light that is yellow, green, red, and/or combinations thereof upon absorbing light emitted by one or more LED chips 82. In some aspects, light emitter components shown and described herein can be adapted to emit approximately 3500 lumens (lm) at approximately 5000K and approximately 31 Watts (W). In other aspects, light emitter components shown and described herein can be adapted to emit approximately 2400 lm at approximately 5000K and approximately 18 Watts.

Figure 7C:
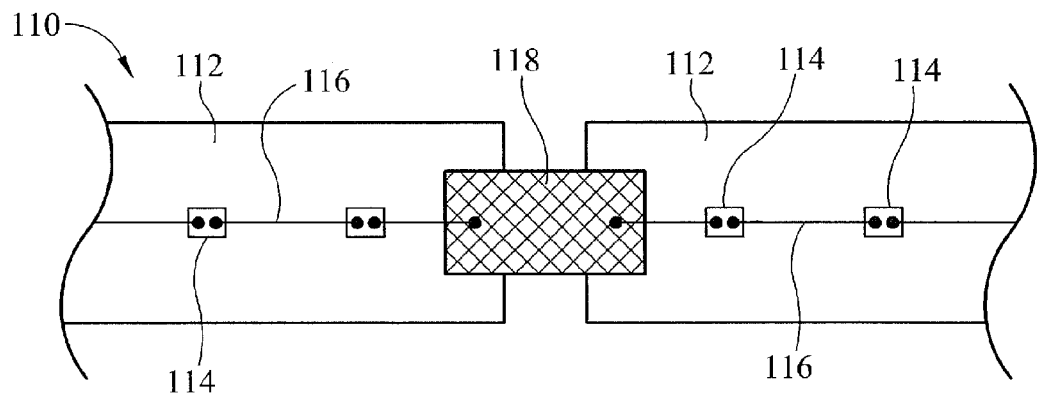
Figure 8:
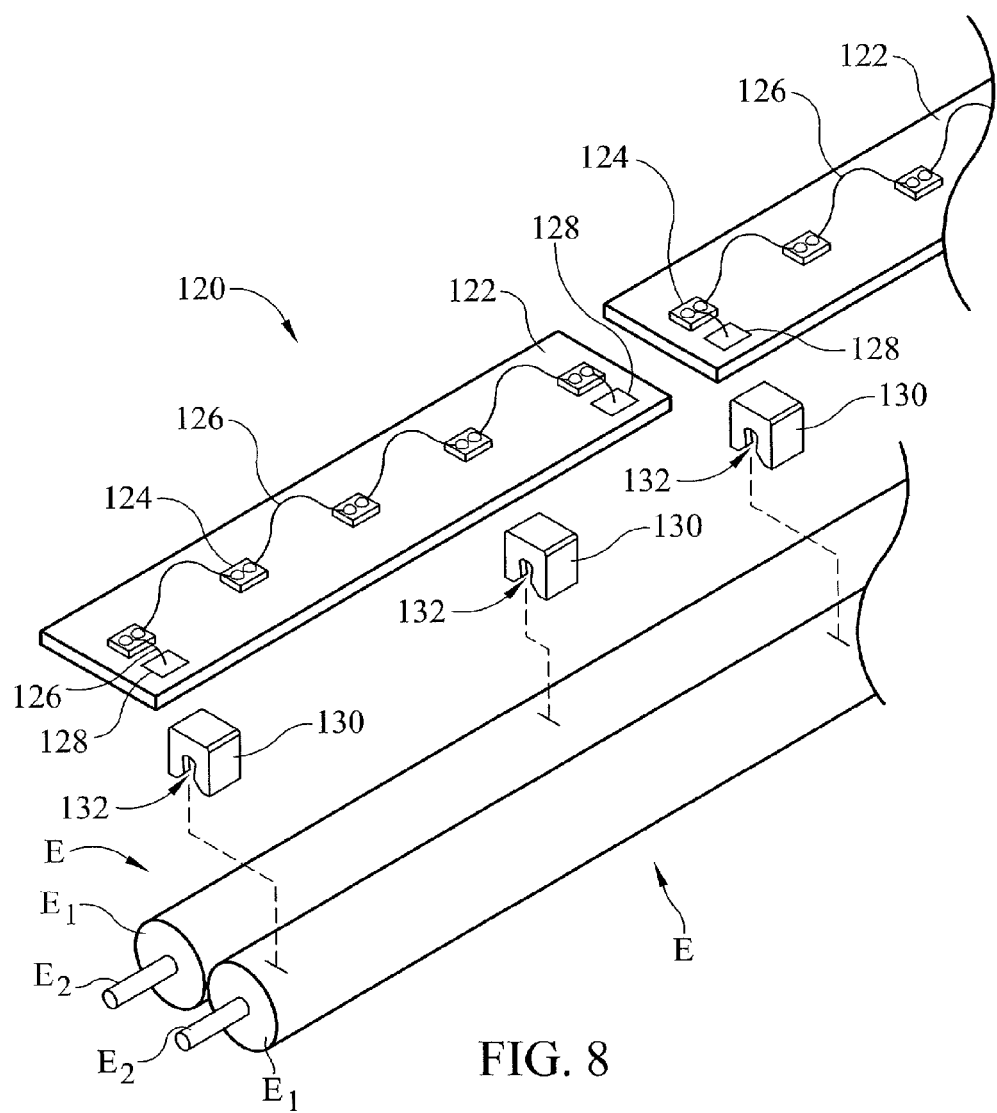
FIG. 8 is a perspective view illustrating light emitter components and a system according to one aspect of the disclosure herein.
Figure 9:
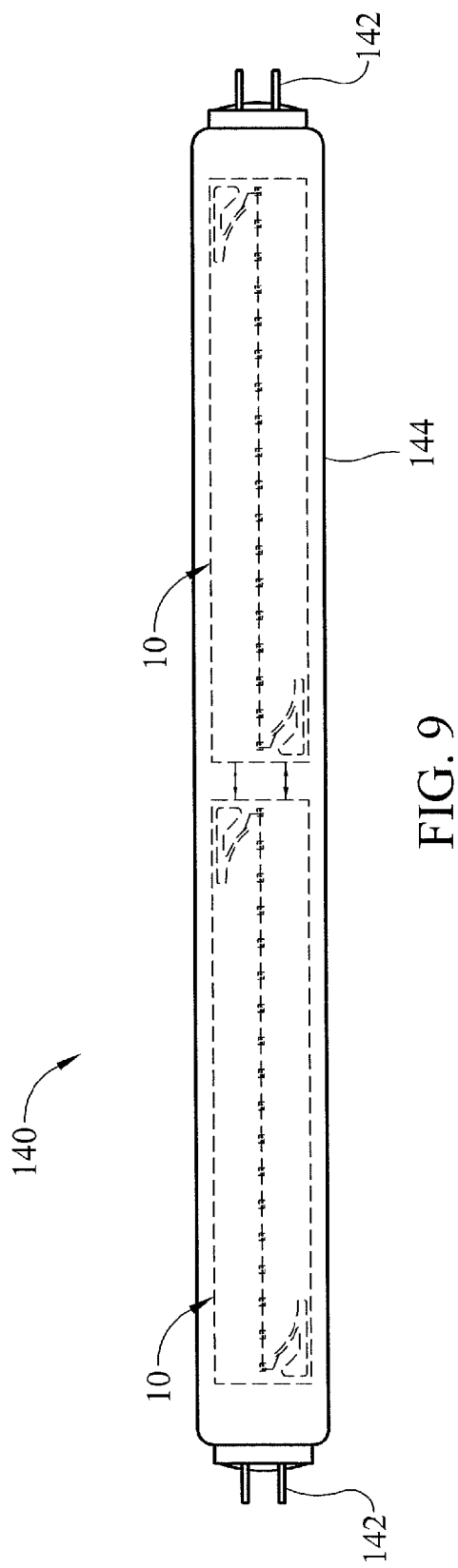
FIG. 9 is a top plan view illustrating a light emitter system according to one aspect of the disclosure herein.

Systems of light emitter components are illustrated in FIGS. 7A to 9. FIGS. 7A to 8 illustrate one or more light emitter components disposed adjacent each other and electrically connected to each other. FIG. 9 illustrates a light emitter component system comprising a lighting fixture, including but not limited to a bulb which can be used in overhead lighting. Any type of lighting fixtures, bulbs, and/or products can be provided and is contemplated herein.

FIG. 7A illustrates a light emitter component system generally designated 90 comprising more than one light emitter component 10. In some aspects, only two light emitter components 10 can be provided in system 90. In some aspects, more than two light emitter components 10 can be provided in system 90. Each component 10 can comprise more than one LED chip 14 disposed over substrate 12. LED chips 14 can be serially connected in a string via wirebonds 16. Notably, first and second traces generally designated 18 and 20 for supplying current to each string of LED chips 14 can be provided at opposing ends or outermost edges of substrate 12. In one aspect, traces can only provided at the outermost ends or edges of a substantially rectangular substrate 12.

In some aspects, bus wires B can be provided to physically and/or electrically connect adjacent light emitter components 10. In some aspects, bus wires B can convey electrical current from a power source (not shown) and "bus" the current to adjacent light emitter components 10. In some aspects, bus wires B can electrically connect and/or electrically couple multiple light emitter components 10 without requiring electrical traces to be deposited or applied along the length of substrates 12. This can advantageously reduce a cost of manufacturing light emitter components 10, by incorporating bus wires B which reduce processing materials and/or costly processing steps associated with depositing trace layers and/or materials along a length of each substrate 12.

In some aspects, a plurality of bus wires B can connect to portions of respective first and second traces 18 and 20 of a plurality of multiple components 10 via soldering to first attachment portions A1 of adjacent boards or substrates 12. In some aspects, a first bus wire B can connect to a first trace 18 of a first component 10 and another first trace 18 of an adjacent, second component 10 providing for electrical communication therebetween. Similarly, a different bus wire B can connect to a second trace 20 of a first component 10 to another second trace 20 of an adjacent, second component 10. Notably, bus wires B can terminate between adjacent first traces 18 and adjacent second traces 20 of adjacent substrates 12, thereby channeling electrical current between adjacent substrates, and electrically communicating with multiple strings of LED chips 14 which also terminate at first and second traces 18 and 20 of adjacent substrates.

In some aspects, bus wires B can become inserted into connectors (e.g., C1 and C2 of FIGS. 3A/3B), such as IDC connectors, which can be electrically connected to portions of first and second traces 18 and 20. In some aspects, bus wires B can be disposed substantially parallel to the string of LED chips 14. In some aspects, the string of LED chips 14 can be substantially parallel with an edge of substrate 12.

FIG. 7B illustrates another embodiment of a system generally designated 95 of light emitter components. In one aspect, system 95 can comprise at least two, or more than two light emitter components 100. In some aspects, light emitter components 100 can be substantially longitudinally aligned such that system 95 can comprise a longitudinal row or elongated line of emitter components generally designated 100. Light emitter components 100 can be similar in form and function to previously described light emitter components (e.g., 10 and 30 in FIGS. 1 and 2). Light emitter components 100 can comprise ceramic or ceramic based substrates 102. Each substrate can comprise first and second traces disposed at opposing edges or ends. Each trace can comprise first, second, and intervening attachment portions A1, A2, and A3, respectively. In some aspects, electrical connectors (e.g., $C_1/C_2$ FIGS. 3A/3B) can be disposed over portions of each trace as previously described. Light emitter components can comprise two or more LED chips 104 electrically connected in series via one or more wirebonds 106. Wirebonds 106 can comprise Au, Ag, Cu, Al, or any combination or alloy thereof.

In some aspects, traces can be disposed only at opposing ends of substrate 102. Electrical traces can directly connect and/or pass electrical current directly into LED chips 104. Notably, each light emitter component 100 can comprise at least one bus attachment area or surface, which can be separate and/or distinct from each trace. For example, one or more bus surfaces or bus areas 108 can be provided along the edges and/or along a length of substrate 102. In some aspects, each bus area 108 can be disposed substantially parallel to outermost edges of substrate 102, and substantially parallel to the string of LED chips 104. In some aspects, bus areas 108 can be disposed along and parallel to the longer sides of substrate 102, where substrate 102 comprises a rectangle.

In some aspects, each bus area 108 can comprise a thin layer of a conductive foil or a thin conductive adhesive foil which can be inexpensive to manufacture and apply to portions of substrate 102. For example, in some aspects bus areas 108 can comprise a metal foil which can be applied via an adhesive, glue, epoxy, or other tacky material to portions of substrate 102. In some aspects, bus areas 108 of adjacent components 100 can be physically and/or electrically connected to portions of traces via wirebonds 106. Thus, in some aspects, bus areas 108 can "bus" electrical current down the substrate 12 panel and into an adjacent board via simple electrical connectors such as wirebonds 106. In some aspects, bus areas 108 can be electrically connected to portions of first and second traces, such as first attachment areas A1 of traces via wirebonds 106.

FIG. 7C illustrates a further embodiment of a light emitter component system 110 comprising two or more light emitter components. For illustration purposes, system 110 is illustrated as comprising two adjacent component substrates 112, however, more than two components can be provided. Each substrate 112 can support and/or attach to at least one string of a plurality of LED chips 114. Each string of LED chips 114 can be serially connected via wirebonds 116. Wirebonds 116 can comprise Au, Ag, Cu, Al, or any combination or alloy thereof. Notably, each substrate 112 can be devoid of individual traces fully contained on each substrate. Rather, in some aspects, at least one trace 118 can be shared between at least two adjacent substrates 112. In further aspects, at least one trace 118 can be shared between multiple adjacent substrates 112. In some aspects, trace 118 can be disposed proximate an end portion at least two adjacent substrates 112, and can overhang and/or overlap portions of each substrate 112. In some aspects, trace 118 can be flexible and can comprise an adhesive material applied to and/or integrally formed on a backside of trace 118 for adhering to portions of adjacent substrates 112. A portion of trace 118 can comprise a conductive material for electrically connecting at least two adjacent strings of LED chips 114 on at least two adjacent substrates 112 via wirebonds 116. Wirebonds 116 of adjacent LED strings disposed on adjacent boards or substrates 112 can terminate at portions of trace 118. In some aspects, multiple traces 118 can be disposed between multiple adjacent substrates.

FIG. 8 illustrates a light emitter system generally designated 120 comprising multiple light emitter components longitudinally aligned over one or more electrical wires E. Electrical wires E can provide electrical current either directly or indirectly from a power source (not shown). Each component of a plurality of adjacent components can comprise a panel substrate 122 of ceramic or a ceramic based material. A plurality of LED chips 124 can be arranged in at least one string or row over substrate 122. The plurality of LED chips 124 can be electrically connected in series via wirebonds 126. Wirebonds 126 can connect and/or terminate at bond pads of adjacent LED chips 124. In some aspects, wirebonds 126 extending from first and last LED chips 124 of a string of LED chips 124 can terminate at one or more traces 128 which can be disposed proximate the end portions of each substrate 122. In some aspects, traces 128 can be only disposed proximate end portions of each substrate 122. This can advantageously reduce processing steps associated with depositing traces along entire edges of substrates in addition to reducing material. This can also advantageously reduce an amount of material which may potentially interfere with light emitted by one or more LED chips 124.

In some aspects, at least one connector 130 can be disposed on a backside surface of substrate 122, on an opposing surface from where LED chips 124 are connected. Notably, electrical current can be conveyed into more than one substrate 122 via connectors 130 disposed on a backside of each panel substrate 122. Each connector 130 can comprise an IDC connector adapted to displace an insulated portion $E_1$ of electrical wire and "bite" into or contact conductive portion $E_2$ of electrical wire generally designated E. For example, electrical wire E can be received in groove or gap portions 132 of IDC connectors 130. Side walls of gap portions generally designated 132 can pierce insulated portions $E_1$ and contact conductive portions $E_2$. Current can pass from electrical wire E into each trace 128 using electrical vias internally disposed within portions of substrate 122 and/or other conductive material disposed along lateral sides of substrate 122, extending between connectors 130 and traces 128.

In some aspects, connectors 130 can electrically communicate with traces 128. Connectors 130 can comprise a metal or metal alloy adapted to electrically communicate with traces 128 using internal through-holes such as vias or lateral traces. In some aspects, traces 128 are not necessary and/or optional, as LED chips 124 can be mounted directly over and/or wirebonded to an electrical through-hole or via. Thus, in certain aspects, the upper surface of substrate 122 may not comprise any traces, as LED chips 124 can directly mount over and/or be wirebonded to portions of a via. In some aspects, traces 128 and/or vias or through-holes can electrically communicate with LED chips 124. Notably, in some aspects, substrates 122 can be devoid of any trace. In some aspects, substrates 122 can be devoid of traces extending a full or substantially full length of substrate 122, as current can be bussed from a power source to LED chips 124 via underlying electrical wires E. This can advantageously improve the brightness and reduce the cost associated with providing light emitter components and systems described herein.

FIG. 9 illustrates another light emitter component system generally designated 140. Light emitter system 140 can comprise more than one light emitter component 10. Light emitter components generally designated 10 are shown in phantom lines as they may not be visible from outside of system 140. In some aspects, light emitter components 10 can be physically and/or electrically coupled as indicated by the double sided arrows disposed between components 10. Light emitter system 140 can comprise a bulb for use in strip lighting, tube lighting and/or overhead lighting products. System 140 can comprise two pins 142 disposed at each end. Electrical current can pass into system 140 via pins 142. In some aspects, light emitter components 10 can receive current by coupling and extending bus wires from pins 142. Light emitter components 10 can be contained within a system or bulb housing 144. In some aspects, housing 144 can include a tube diffuser. For illustration purposes, light emitter system 140 is shown as an elongated bulb used in lighting products, however, any other system, bulb, or lighting fixture can be provided.

Notably, components described hereinabove can be devoid of labels, legends, and/or other markings within a finish layer of any substrate. That is, any substrate in the embodiments described above and shown for example in the drawings can be free from extraneous markings and/or legends on a body of the substrate, as such labels can block, absorb, or otherwise interfere with light.

Figure 10A:
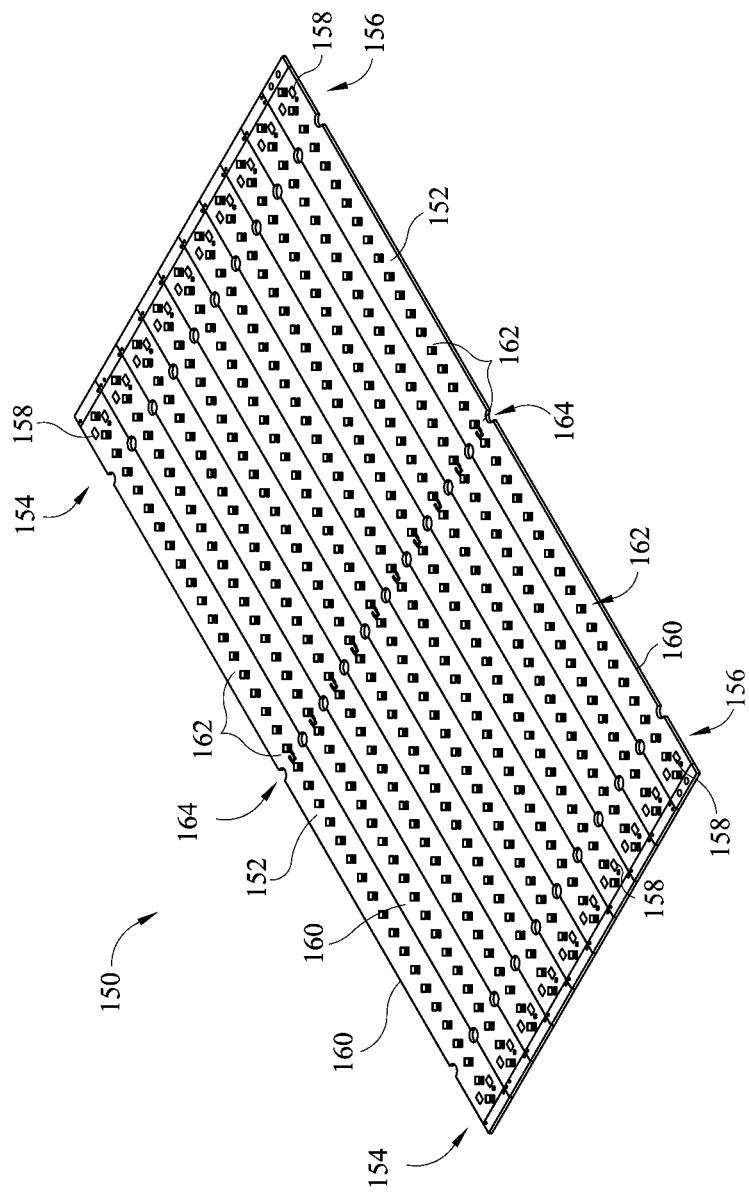
FIGS. 10A to 10C are perspective and top plan views illustrating light emitter components and systems according to aspects of the disclosure herein.
Figure 10B:
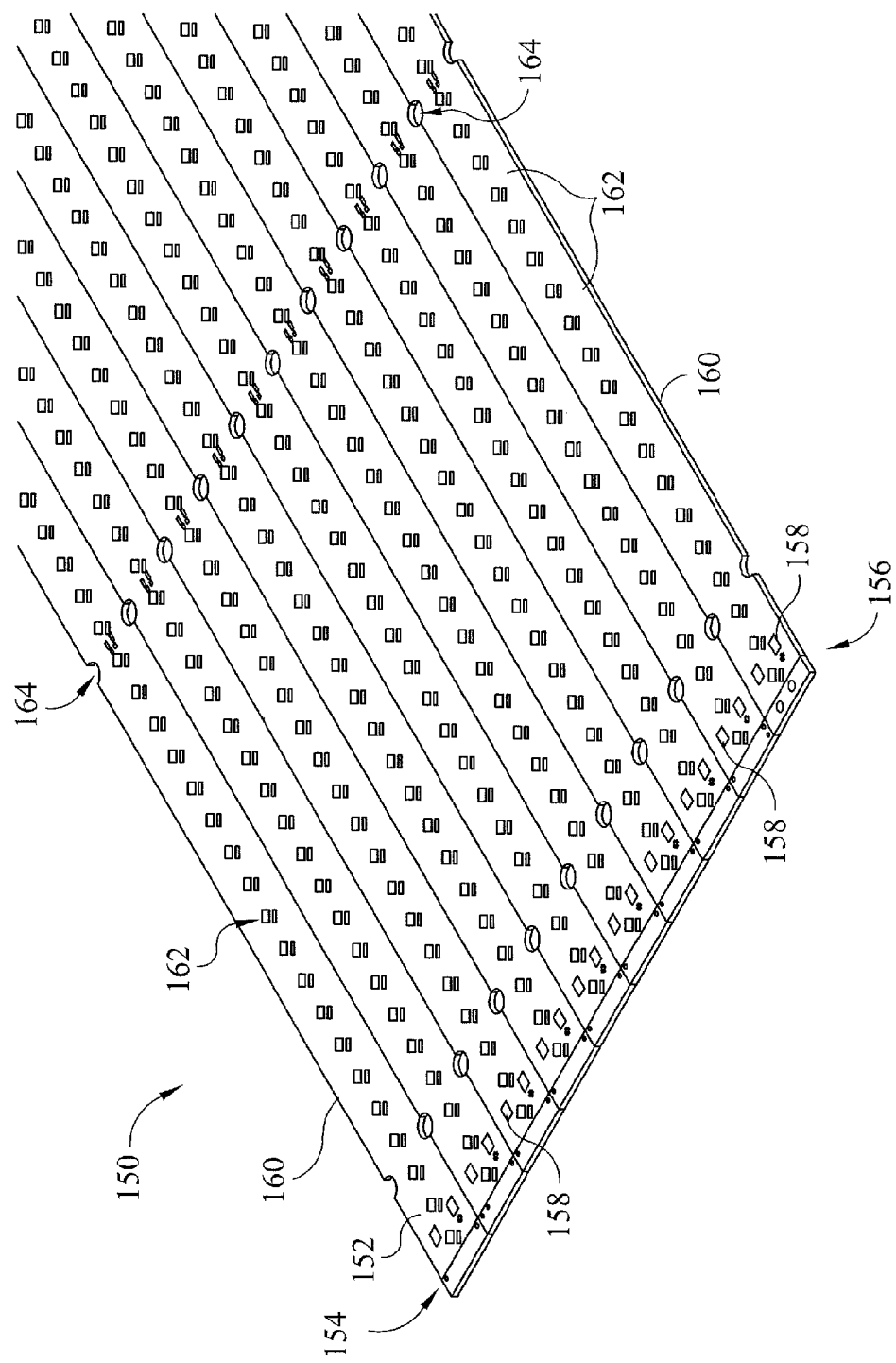

FIGS. 10A and 10B illustrate top perspective views of an array, generally designated 150, of further embodiments of light emitter components 152. Notably, components 152 can be manufactured and/or initially received within an array 150. Components 152 can be optionally processed within array 150 for improving processing times and/or efficiency. Individually processing individual components 152 (e.g., die attaching LED chips and/or packages, etc.) is also contemplated. In some aspects, individual components 152 can be singulated from array 150 via breaking, sawing, dicing, or otherwise physically separating a single component from array 150.

In some aspects, each component 152 can comprise a first end generally designated 154 and a second end generally designated 156. One or more attachment surfaces 158 can be provided proximate each of first and second ends 154 and 156. Attachment surfaces 158 can comprise, for example, attach pads, solder pads, clamps, clips, connectors, etc., adapted to electrically and/or physically attach to one or more components carrying electrical signal or power, and for transferring that signal or power into portions of a component substrate 160, and for passing the current to multiple LED devices (e.g., chips and/or packages) disposed over component 152.

Still referring to FIGS. 10A and 10B, in some aspects each component 152 can comprise a substantially elongated substrate 160 body adapted to support one or more LED devices. In some aspects, substrate 160 can comprise multiple layers, such as a base or core layer, a conductive layer, and one or more optional reflective layers. Notably, component 152 can comprise multiple areas of exposed metal or traces, generally designated 162 which can be oriented particularly or angled with respect to each other, as described further herein. One or more attachment areas 164 can be provided along portions of lateral side edges of component 152 for securing component within a lighting system, such as a lighting fixture, lamp, or bulb.

In some aspects component 152 can, for example, have a length of approximately 20 millimeters (mm) or more, approximately 100 mm or more, approximately 150 mm or more, approximately 200 mm or more, approximately 250 mm or more, or more than approximately 300 mm. In some aspects, component 152 can, for example, have a width of approximately 5 mm or more, approximately 10 mm or more, approximately 15 mm or more, approximately 20 mm or more, or more than approximately 25 mm. In some aspects, component 152 can have an overall length and width of approximately 262.5 mm×15 mm, respectively. Components described herein can have any suitable shape, for example, such as a square shape, a rectangular shape, a non-rectangular shape, a circular shape, a curved shape, a symmetric shape, an asymmetric shape, and/or any other shape. Any size, shape, and/or thickness of components can be provided herein.

Figure 10C:
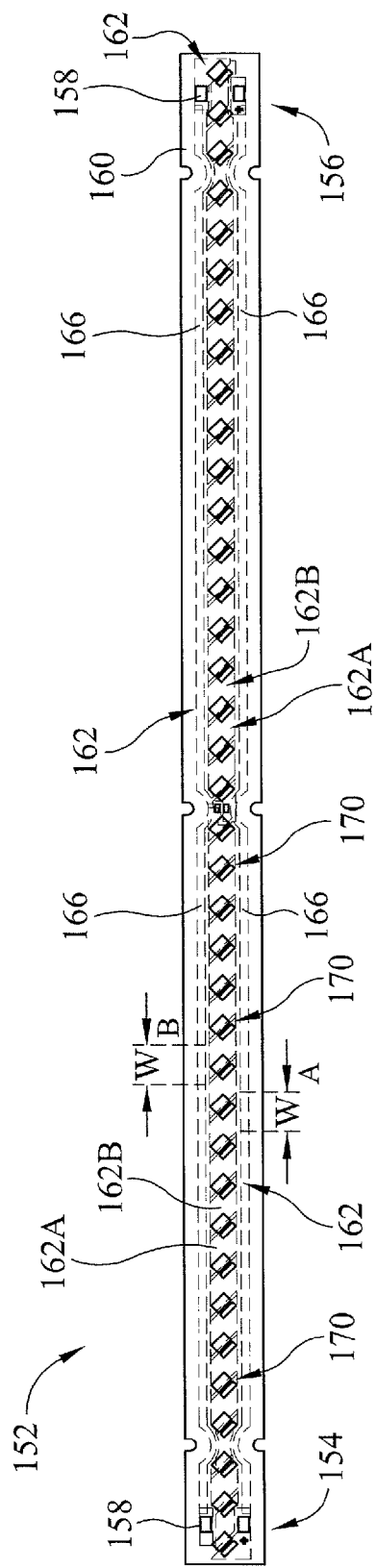

FIG. 10C illustrates a top plan view of component 152. Areas which may not be visible from the outside are indicated in broken lines. As FIG. 10C illustrates, each trace 162 can comprise a first portion 162A and a second portion 162B which together, can comprise an anode/cathode pair for supplying current to LED devices disposed thereover. In some aspects, first portion 162A can comprise a first width $W_A$ and second portion 162B can comprise a second width $W_B$. As the solid and broken lines illustrate, portions of first and second portions 162A and 162B can be internally disposed within substrate 160 and other portions can be exposed on a surface of substrate 160. The multiple traces 162 including portions 162A and 162B can be disposed along substrate 160 and can be angled with respect to a longitudinal axis of substrate 160. In some aspects, portions 162A and 162B can alternate over substrate such that current can flow between adjacent LED devices (not shown) to be attached or mounted over traces 162. In some aspects, one or more diagonally disposed gaps 170 can be provided between first and second portions 162A and 162B of each trace 162.

Component 152 can further comprise one or more bus bars 166. Bus bars 166 can effectively "bus" electrical current along substrate 160 and between attachment areas 158 at opposing ends 154 and 156. Bus bars 166 are illustrated in phantom lines, as they may be internally disposed within substrate 160. In some aspects, bus bars 166 and attachment areas 158 can comprise one continuous area, portion, or layer of conductive material, such as a metal or metal alloy. Notably, components described herein can be devoid of labels, legends, and/or other markings within a finish layer of substrate 160. That is, substrate 160 can be free from extraneous markings and/or legends down, along or on the elongated body of substrate 160, as such labels can block, absorb, or otherwise interfere with light.

In some aspects, traces 162 provide mounting areas over which one or more LED devices (not shown) can be provided. Notably, by orienting or angling traces 162 as shown with respect to a longitudinal axis of component 152, LED devices (not shown) can also be provided at angles with respect to each other and/or with respect to a longitudinal axis of component 152. This can advantageously minimize light absorption or blockage of light which can occur when LED devices are non-angled with respect to each other and/or a longitudinal axis of component 152. In some aspects, traces 162 can comprise any conductive material, including for example one or more materials such as Cu, Ag, Ti, Ni, Au, Pt, Pd, ENIG, combinations and/or alloys thereof, and/or any other suitable material. As discussed below, components 152 can comprise non-angled traces and/or non-angled LED devices as well, which can be used in combination with angled traces 162 and angled LED devices.

FIG. 10C illustrates a top plan view of component 152 and portions of traces which may not be visible from the outside are indicated in phantom lines. Notably, in some aspects, LED devices (not shown) can be provided and mounted over portions of traces 162. In some aspects, LED devices can be disposed directly over traces 162 appearing in solid lines, which signify areas of exposed metal. LED devices (not shown) can comprise LED packages having a submount or substrate, at least one LED chip disposed over the submount, and an optical element disposed over portions of the LED chip and/or submount. Notably, angling LED devices (e.g., packages or chips) over component 152 can improve brightness and/or light extraction, as emission profiles of adjacent angled LED devices may not interfere as much with adjacent devices as compared to non-angled devices, thus, angling devices with respect to substrate 160 can result in a brighter outcome. Additionally, when using a diffuser such as a tube (e.g., FIG. 9), the pixilation may appear to be less (i.e., improved) compared to components having non-angled devices.

In some aspects, LED devices for component 152 can comprise LED packages such as those disclosed in commonly assigned U.S. patent application Ser. No. 13/649,052, filed on Oct. 10, 2012, the disclosure of which is hereby fully incorporated by reference herein. For example, in some aspects LED packages shown in FIGS. 4 and 5 of U.S. application Ser. No. 13/649,052 can be provided over angled portions 162A and 162B of traces 162. Notably, mounting of LED packages over angled portions 162A and 162B of traces 162 can be provided by physically and electrically connecting bottom contacts of the LED packages directly over portions of 162A and 162BA. In some aspects, such packages can have substantially domed or hemispherical shaped optical elements, or substantially square or cube shaped optical elements. Notably, metal traces 162 (e.g., and portions of 162A and 162B) can be angled with the LED packages disposed thereon, and can provide large areas around the LED package or device to allow for more heat dissipation, thereby improving thermal management within component 152.

Figure 11:
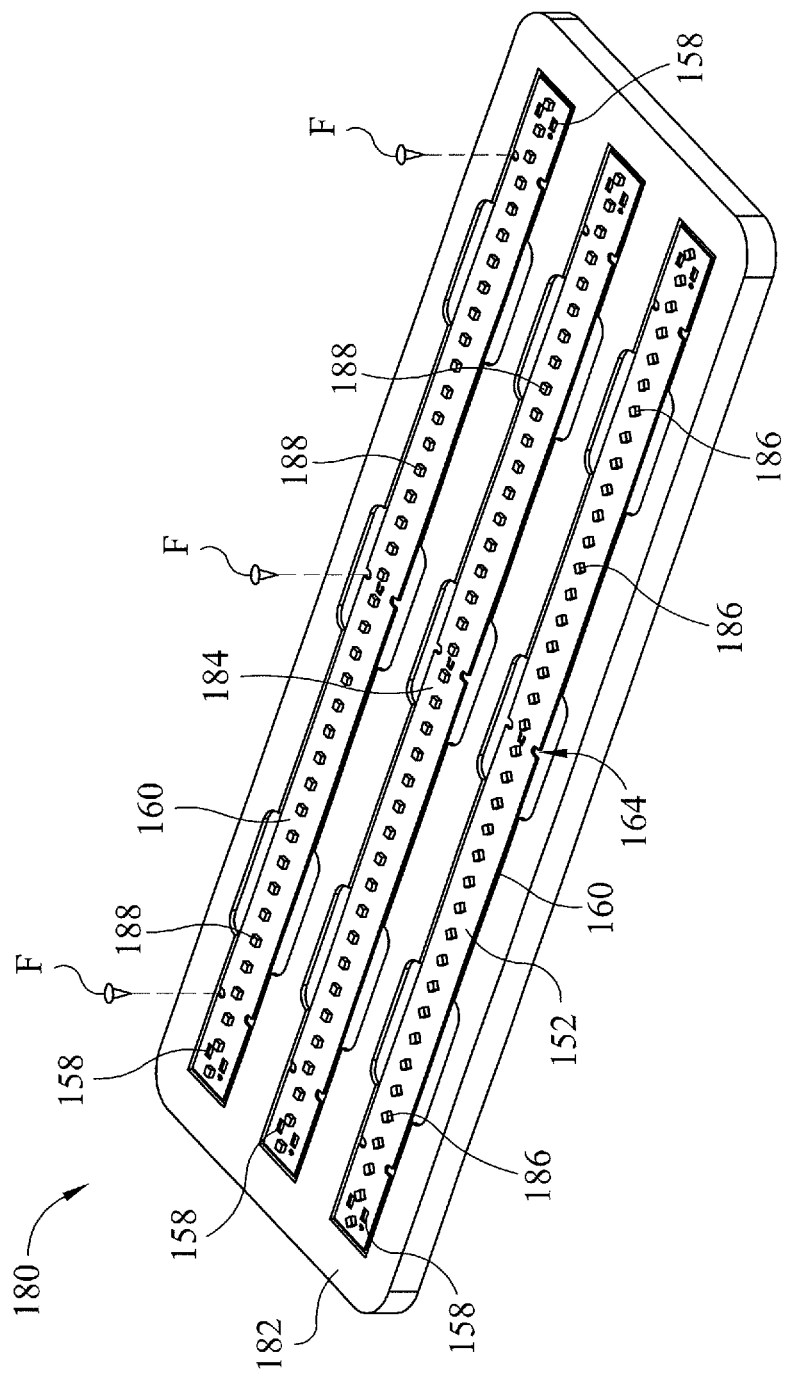
FIG. 11 is a perspective view illustrating a light emitter system according to aspects of the disclosure herein.

FIG. 11 illustrates a system, generally designated 180, of light emitter components. System 180 can comprise a body or support 182 over which light emitter components can be mounted. In some aspects, support 182 can comprise a substantially rectangular body and can comprise a portion of a lighting fixture or lighting product. In some aspects, support 182 can be adapted to secure components and/or bulbs for tube or strip type lighting applications as shown in previously described FIG. 9. In some aspects, a bulb (not shown), tube, or diffusing member (not shown) can be disposed about portions of support 182 and light emitter components disposed thereon.

As FIG. 11 illustrates, system 180 can comprise multiple elongated light emitter components, 152 (FIGS. 10A to 10C) and 184. Components 184 can be similar in form, function, and appearance as previously described component 152, one difference being that the traces and respective LED devices are in non-angled positions with respect to each other and/or with respect to the elongated body of component 184. As FIG. 11 illustrates, each component 152 and 184 can be secured within portions of support 180 by inserting screws and/or other mechanical fasteners F into attachment areas 164 disposed in each component. In some aspects, attachment areas 164 can be provided in lateral side edges of each component 154 and 184.

Notably, as FIG. 11 illustrates, system 180 can comprise a combination of components 152 and 184. That is, component 152, which can utilize diagonally disposed and/or angled packages or LED devices 186, can be used in combination with components 184 which have non-angled packages or LED devices 188. This can provide customized light output and beam patterns having multi-directional light emission, where desired.

Figure 12:
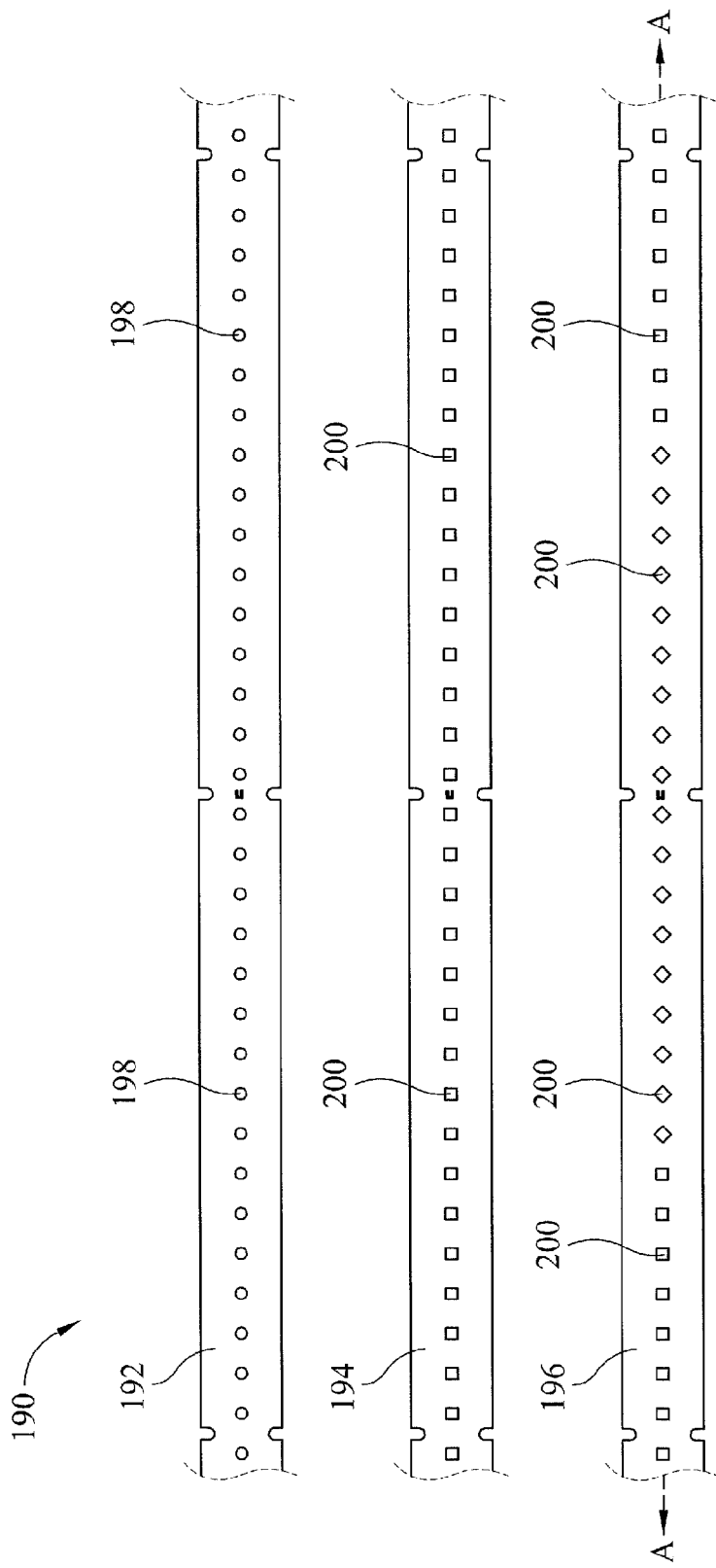
FIG. 12 is a top view illustrating a light emitter system according to aspects of the disclosure herein.

FIG. 12 illustrates light emitter components for use within a system, generally designated 190. In some aspects, system 190 can comprise three light emitter components such as a first light emitter component 192, a second light emitter component 194, and a third light emitter component 196. More or less than three light emitter components can be disposed within a lighting system 190. In some aspects, each light emitter component can be similar to component 152 (and/or other components as described herein); however, it may utilize differently shaped and/or angled LED devices.

In some aspects, first light emitter component 192 can comprise non-angled LED devices 198 which can be disposed within a substantially linear row. In some aspects as FIG. 12 schematically illustrates, devices 198 can comprise an LED package having a substantially rounded or hemispheric shaped domed lens instead of a cubic shaped lens.

In some aspects, second light emitter component 194 can comprise non-angled LED devices 200 which can be disposed within a substantially linear row. In some aspects as FIG. 12 schematically illustrates, devices 200 can for example comprise an LED package having a substantially cubic shaped lens instead of a hemispheric shaped lens, such as for example those disclosed in commonly assigned U.S. patent application Ser. No. 13/649,052, filed on Oct. 10, 2012, which application has been and is fully incorporated by reference herein.

In some aspects, third light emitter component 196 can comprise non-angled LED devices 200 used in combination with angled devices 200. In some aspects, LED devices 200 can be angled between approximately 1° and 90° with respect to a longitudinal axis, denoted by lines A at the end of third component 196. That is, in some aspects as FIG. 12 schematically illustrates, devices 200 can comprise an LED package having a substantially cubic shaped lens, which can be alternated or non-alternated with respect to longitudinal axis A. Notably, any combination of LED packages (e.g., domed or cubic lenses) and/or angled and non-angled components can be used together within system 190. Any number of LED devices 200 can be provided over component 196, such as 10 devices or more, 20 devices or more, 30 devices or more, or more than 50 devices. In some aspects, 38 devices 200 can be provided.

Figure 13:
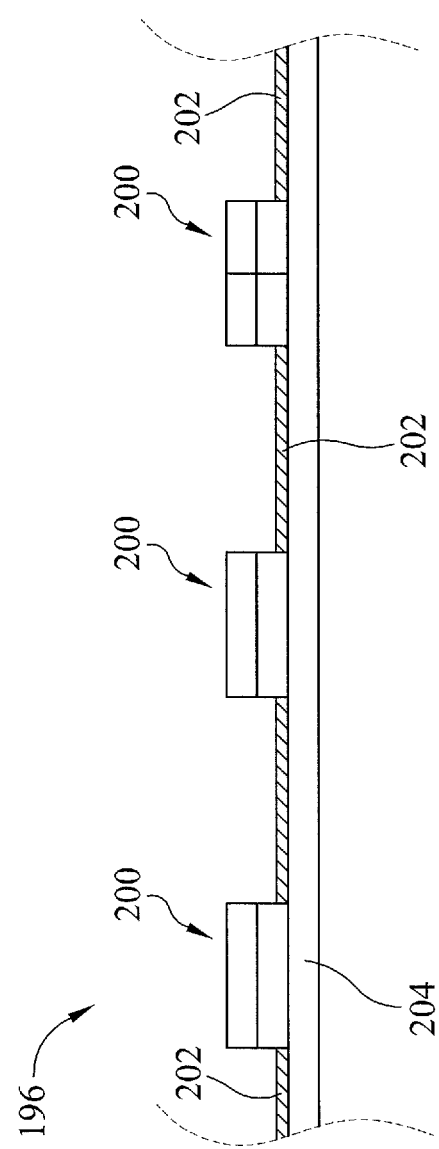
FIG. 13 is a side view illustrating a light emitter component of a light emitter system according to aspects of the disclosure herein.

FIG. 13 is a side view of LED component 196 in FIG. 12. As FIG. 13 illustrates, a reflective coating 202 can be applied over portions of component 196. In some aspects, component 196 can comprise a substrate 204. In some aspects, substrate 204 can be multi-layered with one or more reflective layers, conductive layers, and/or insulating layers. Thus, in some aspects coating 202 can comprise the second or third reflective coating of component 196. In some aspects, coating 202 can comprise a non-metallic (e.g., plastic, polymeric) reflective coating, such as solder mask. In some aspects, coating 202 can be white. Coating 202 can be applied via printing, screen-printing, painting, coating, depositing, layering, or any other suitable application method.

As described above, novel traces, trace overlays, bus attachments, connectors, optical materials, wirebonds, and/or other features described herein can be provided alone and/or in combination for providing components and systems having improved optical performance at a lower cost. Embodiments as disclosed herein may provide one or more of the following beneficial technical effects: improved brightness; improved light extraction; improved efficiency; reduced manufacturing cost of light emitter components and/or systems; improved thermal management (and concomitant improvement of operating life); and/or improved manufacturability of light emitter components.

While the subject matter herein has been has been described in reference to specific aspects, features, and/or illustrative embodiments, it will be appreciated that the utility of the described subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter component, comprising:
   an elongated substrate having first and second ends opposing each other along a length of the substrate, wherein the length of the substrate is greater than a width of the substrate;
   a first trace and a second trace provided on a surface of the substrate, the first trace being disposed proximate the first end of the substrate and the second trace being disposed proximate the second end of the substrate, wherein the first trace and the second trace are spaced apart a distance that is greater than the width of the substrate, and wherein no other trace is disposed on the substrate between the first and second traces; and
   a string of LED chips provided on the substrate, wherein the string of LED chips is disposed between the first and second ends of the substrate.

2. The component of claim 1, wherein a majority of the LED chips are spaced apart from the first trace by approximately 2 millimeters (mm) or more.

3. The component of claim 1, wherein the first trace and the second trace are provided only at the outermost opposing ends of the elongated substrate.

4. The component of claim 1, wherein the first trace is configured to overlap a portion of a first adjacent substrate.

5. The component of claim 4, wherein the second trace is configured to overlap a portion of a second adjacent substrate.

6. The component of claim 1, wherein the first and second traces comprise a flexible material.

7. The component of claim 1, wherein the first and second traces comprise an adhesive layer between the first and/or second traces and the substrate.

8. The component of claim 1, wherein the substrate comprises a ceramic material.

9. The component of claim 1, wherein the substrate comprises a length of approximately 20 mm or more.

10. The component of claim 1, wherein the substrate comprises a length of approximately 80 mm or more.

11. The component of claim 1, wherein the string of LED chips is serially connected between the first trace and the second trace.

12. The component of claim 1, wherein the string of LED chips comprises 10 or more LED chips.

13. The component of claim 1, wherein the string of LED chips comprises 20 or more LED chips.

14. The component of claim 1, wherein a bus wire extends along a portion of the elongated substrate.

15. The component of claim 14, wherein the bus wire is disposed on a back side of the substrate which opposes the string of LED chips.

16. The component of claim 1, wherein a separate conductive foil area is disposed over the surface of the substrate and extends between portions of the first and second trace.

17. The component of claim 1, further comprising at least one insulation displacement connector (IDC) disposed on the substrate.

18. The component of claim 17, wherein a first IDC is disposed over the first trace and a second IDC is disposed over the second trace.

19. The component of claim 17, wherein the IDC is disposed on a back side of the substrate which opposes the string of LED chips.

20. The component of claim 1, wherein the first trace and the second trace each comprise on the surface of the substrate a first attachment portion, a second attachment portion, and an intervening attachment portion disposed therebetween.

21. The component of claim 1, wherein each of the first trace and the second trace comprise a length that is less than approximately one half of an overall length of the substrate.

22. The component of claim 1, wherein each of the first trace and the second trace comprise a length that is less than approximately one quarter of an overall length of the substrate.

23. A light emitter component comprising:
   a substrate;
   a first trace and a second trace provided on a surface of the substrate; and
   a string of LED chips provided on the substrate;
   wherein portions of the substrate that are disposed between the first trace and the second trace are devoid of one or more additional traces disposed thereon;
   wherein a majority of the LED chips are spaced apart from the first trace by approximately 2 millimeters (mm) or more;

wherein the substrate comprises a rectangular substrate having a length that measures greater than a width;
wherein the first trace and the second trace are provided at outermost opposing ends of the length; and
wherein the first trace and the second trace are spaced apart a distance that is greater than the width of the substrate.

24. The component of claim 23, wherein a majority of the LED chips are spaced apart from the first trace by approximately 5 millimeters (mm) or more.

25. The component of claim 23, wherein length is 20 millimeters (mm) or more.

26. The component of claim 25, wherein the width is 5 millimeters (mm) or more.

27. The component of claim 23, wherein the substrate comprises a ceramic material.

28. The component of claim 23, wherein the length is approximately 80 mm or more.

29. The component of claim 23, wherein the string of LED chips is serially connected between the first trace and the second trace.

30. The component of claim 23, wherein the string of LED chips comprises 20 or more LED chips.

31. The component of claim 23, wherein a bus wire extends along a portion of the elongated substrate.

32. The component of claim 31, wherein the bus wire is disposed on a back side of the substrate which opposes the string of LED chips.

33. The component of claim 23, wherein a separate conductive foil area is disposed over the surface of the substrate and extends between portions of the first and second trace.

34. The component of claim 23, further comprising at least one insulation displacement connector (IDC) disposed on the substrate.

35. The component of claim 34, wherein a first IDC is disposed over the first trace and a second IDC is disposed over the second trace.

36. The component of claim 34, wherein the IDC is disposed on a back side of the substrate which opposes the string of LED chips.

37. The component of claim 23, wherein the first and second traces comprise a flexible tape.

38. The component of claim 23, wherein the first and second traces comprise an adhesive layer between the first and/or second traces and the substrate.

39. A method of providing a light emitter component, the method comprising:
providing an elongated substrate having a first end and a second end opposing each other along a length of the substrate, wherein the length of the substrate is greater than a width of the substrate;
providing a first trace and a second trace on a surface of the substrate, the first trace being disposed proximate the first end of the substrate and the second trace being disposed proximate the second end of the substrate, wherein the first trace and the second trace are spaced apart a distance that is greater than the width of the substrate, and wherein no other trace is disposed on the substrate between the first and second traces; and
providing a string of LED chips on the substrate, wherein the string of LED chips is disposed between the first and second ends of the substrate.

40. The method of claim 39, wherein providing the first trace comprises providing a first trace that overlaps a portion of the elongated substrate.

41. The method of claim 39, wherein providing the first trace comprises applying an adhesive layer of the first trace over a portion of the elongated substrate.

42. The method of claim 39, wherein providing the elongated substrate comprises providing a ceramic substrate.

43. The method of claim 39, wherein providing the string of LED chips comprises providing a majority of LED chips that spaced apart from the first trace by approximately 2 millimeters (mm) or more.

44. The method of claim 39, further comprising providing a bus wire along a portion of the substrate.

45. The method of claim 39, further comprising providing an insulation displacement connector (IDC) over a portion of at least one of the first and second traces.

46. The method of claim 39, further comprising providing an insulation displacement connector (IDC) over backside of the substrate on a surface opposing the string of LED chips.

* * * * *